United States Patent
Okada et al.

(10) Patent No.: US 6,534,726 B1
(45) Date of Patent: Mar. 18, 2003

(54) MODULE SUBSTRATE AND METHOD OF PRODUCING THE SAME

(75) Inventors: Masanobu Okada, Sagamihara (JP); Tomoyuki Koide, Komatsu (JP); Kazuyoshi Nakaya, Yokohama (JP); Hiroyuki Nakaji, Yokohama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/696,097

(22) Filed: Oct. 25, 2000

(30) Foreign Application Priority Data

Oct. 25, 1999 (JP) ............................................. 11-303103

(51) Int. Cl.[7] .......................... H01R 12/04; H05K 1/11
(52) U.S. Cl. ..................... 174/263; 174/260; 174/261; 174/266; 29/825; 29/852
(58) Field of Search .............................. 174/259, 263, 174/264, 266, 260, 261, 262; 29/852, 825

(56) References Cited

U.S. PATENT DOCUMENTS

| | | | | |
|---|---|---|---|---|
| 5,729,437 A | * | 3/1998 | Hashimoto | .................. 361/760 |
| 6,031,728 A | * | 2/2000 | Bedos et al. | ................. 361/767 |
| 6,100,475 A | * | 8/2000 | Degani et al. | ............... 174/264 |
| 6,272,745 B1 | * | 8/2001 | Kersten et al. | ............... 29/852 |

FOREIGN PATENT DOCUMENTS

JP        63-204693        8/1988

* cited by examiner

*Primary Examiner*—David L. Talbott
*Assistant Examiner*—B Patel
(74) *Attorney, Agent, or Firm*—Keating & Bennett, LLP

(57) ABSTRACT

End-face through holes each comprising a concave-curved end-face opening groove and an end-face electrode covering the inner wall of the groove are formed in the end-faces of a substrate. Furthermore, a solder having a semi-circular shape is attached to the end-face electrode. The solder comprises an electrode facing portion facing the end-face electrode in the end-face groove, and a protuberant portion elongated from the electrode facing portion to protrude on the back-surface side of the substrate. Thereby, even if the substrate or the like is warped, a gap between the end-face electrode and the electrode pad of a mother board can be filled with the protuberant portion of the solder to connect the end-face electrode and the electrode pad to each other.

8 Claims, 18 Drawing Sheets

MODULE SUBSTRATE AND METHOD OF PRODUCING THE SAME

BACKGROUND OF THE INVENTION

1. Field of the Invention

The present invention relates to a module substrate which is electrically connected to a mother board by soldering, and to a method of producing the same.

2. Description of the Related Art

In recent years, with miniaturization of electronic apparatuses and devices, the mounting density of electronic components such as semiconductor IC, active components, passive components, and so forth mounted onto circuit substrates has progressively increased. In view of the importance of intermediate inspection, convenience of mounting, and so forth, electronic components are sub-assembled onto a module substrate, and thereafter, the module substrate is fixed to a mother board by using joining-means such as soldering or the like (e.g., Japanese Unexamined Patent Application Publication 63-204693 and so forth).

The module substrate, in a conventional technique, comprises a substrate 1 composed of an insulating resin material having a substantially quadrangular shape and a wiring formed from a conductor, and plural end-face through-holes 2 formed in the outer peripheral edge of the substrate 1, in a concave curved-shape, as shown in FIGS. 27 to 30. Each end-face through-hole 2 comprises an end-face opening groove 2A having a semi-circular shape and an end-face electrode 2B formed on the inner wall of the end-face opening groove 2A. In the end-face opening groove 2A, a solder 2C is filled. To the end-face electrode 2B, a wiring 3 on the front surface side of the substrate 1 is connected. The end-face electrode 2B is connected via the wiring 3 to an electronic component 4 provided in the center on the front-surface side of the substrate 1.

The module substrate formed as described above is placed on a mother board 5, and in this state, is heated. Thereby, the solder 2C in the end-face through-hole 2 is melted and adheres to an electrode pad 6 on the mother board 5. Thus, soldering can be performed. As a result, a fillet 7 is formed from the solder in a smooth curved shape between the end-face electrode 2B and the electrode pad 6, as shown in FIGS. 28 and 29.

In the above-described conventional technique, the wiring 3 made of a conductor is provided on the front surface of the substrate 1 in order to connect the electronic component 4 mounted onto the front surface of the substrate 1 to the electrode pad 6 of the mother board 5. In some cases, as the substrate 1, employed is a multi-layered substrate in which a grounding wiring pattern for connecting the electronic component to a ground is provided.

In this case, since the thermal expansion coefficients of the wiring 3 made of a conductor or the like and the resin material forming the substrate 1 are different from each other, warpage, which is curved in the directions indicated by arrows A in FIG. 28, may occur in the substrate 1 when the substrate 1 is worked or heated for soldering. Similarly, in some cases, warpage is generated in the mother board 5. Thus, a gap may be formed between the end-face electrode 2B of the substrate 1 and the electrode pad 6 of the mother board 5.

As a result, even if the solder 2C in the end-face through-hole 2 is melted by heating, the solder 2C takes on a substantially spherical shape due to surface tension, as shown in FIG. 30, so that the solder 2C does not contact the electrode pad 6 of the mother board 5. Thus, there arises the problem that the end-face electrode 2B cannot be connected to the electrode pad 6.

Furthermore, recently, electronic apparatuses and devices have been reduced in thickness, and there has been a tendency for the thicknesses 6f the substrate 1 and the mother board 5 to be decreased. For this reason, warpages of the substrate 1 and the mother board 5 are increased, causing the connection between the end-face electrode 2B and the electrode pad 6 to become inadequate.

SUMMARY OF THE INVENTION

Accordingly, it is an object of the present invention to provide a module substrate of which the end-face electrodes can be securely connected to a mother board even if warpage occurs in the substrate or the like, and a method of producing the same.

To achieve the above object, according to the present invention, there is provided a module substrate which comprises a substrate for mounting an electronic component on the front surface side thereof, and end-face electrodes provided in the end-faces defining the outer peripheral edge of the substrate and adapted to be connected to the electronic component.

The end-face electrodes are each provided with a solder to be connected to a mother board provided on the back surface side of the substrate, and the solder is protruded on the back surface side of the substrate.

In the above-described configuration, even if warpage occurs in the substrate, causing a gap between the end-face electrodes of the substrate and the electrode pads of the mother board, the tips of the solders protruding on the back surface side of the substrate securely contact with the electrode pads of the mother board. Accordingly, in this state by melting the solder, the end-face electrodes and the electrode pads are connected to each other, and fillets can be formed between the end-face electrodes and the electrode pads.

Preferably, said substrate is provided with end-face opening grooves each opening at the end-faces of the substrate, said end-face electrodes are provided on the inner walls of the end-face opening grooves, respectively, and said solders each including an electrode facing portion facing the end-face electrode and being disposed in the end-face opening groove, and an protuberant portion provided so as to protrude from the electrode facing portion to the back-surface side of the substrate.

Thus, with the electrode facing portions, the solders can be attached to the end-face electrodes in the end-face opening grooves. With the protuberant portions, the solders can be contacted with the electrode pads of the mother board.

Also preferably, back-surface electrodes connected to the end-face electrodes are each provided on the back-surface side of the substrate in the peripheries of the end-face opening grooves, and the back-surface electrodes are covered with the protuberant portions of the solder, respectively.

Accordingly, by melting the protuberant portions of the solders, the back-surface electrodes and the electrode pads of the mother board can be connected to each other. The end-face electrodes and the electrode pads can be connected to each other via the back-surface electrodes.

Preferably, the end-face opening grooves are each opened in a substantially semi-circular shape at the front-and back-surfaces of the substrate. Thereby, by circularly perforating the substrate, the end-face opening grooves can be easily formed.

More preferably, the solders are each positioned only on the inner side of the substrate with respect to the end-faces thereof. Accordingly, the solders can be accommodated inside of the substrate without protruding from the end-faces of the substrate.

Also preferably, the solders are each positioned on the inner side of the substrate with respect to the end face thereof so as to face the end-face electrode, and moreover, are protruded outward of the substrate with respect to the end-faces thereof.

Accordingly, the solders each positioned on the inner side of the substrate with respect to the end-face thereof can be fixed to the end-face electrode, and moreover, the solder in such a large amount that it cannot be accommodated on the inner side of the substrate with respect to the end-face thereof can be held at a position protruding outward of the substrate with respect to the end-face thereof.

More preferably, the end-face electrodes each comprise a plane electrode formed on the end-face of the substrate, and the solders each having a columnar shape elongating in the thickness direction of the substrate-are fixed to the plane electrodes with a part of the respective solders being protruded on the back-surface side of the substrate.

Thereby, the plane electrodes can be disposed on the end-faces of the substrate without the substrate being perforated or the like. Furthermore, the solders each forming a columnar shape are fixed to the plane electrodes with a part of the respective solders being protruded on the back-surface side of the substrate. Accordingly, even if a gap is generated between the end-face electrodes of the substrate and the electrode pads of the mother board, the tips of the solders can be contacted with the electrode pads of the mother board.

Preferably, the solders are each positioned only on the outer side of the substrate with respect to the end-face thereof.

Thereby, with the solders each positioned on the outer side of the substrate with respect to the end-face thereof, a fillet can be formed between the end-face electrode of the substrate and the electrode pad of the mother board. Thus, the shape and size of the fillet can be confirmed visually, easily. That is, the connection between the end-face electrodes and the electrode pads can be easily confirmed.

According to the present invention, there is provided a method of producing a module substrate comprising a substrate for mounting an electronic component on the front surface side thereof, and end-face electrodes formed in the outer peripheral edge of the substrate and adapted to be connected to the electronic component, the end-face electrodes each being provided with a solder to be connected to a mother board, which comprises the steps of forming the solder into a columnar shape longer than the thickness of the substrate, and providing the solder on the end-face electrode with a part of the solder having the columnar shape being protruded on the back-surface side of the substrate.

Accordingly, the solders each formed into a columnar shape can be fixed to the end-face electrode, and a part of the solder can be protruded on the back-surface side of the substrate. Gaps generated between the end-face electrodes and the electrode pads can be filled with the solders protruding on the back-surface side of the substrate, and the end-face electrodes and the electrode pads can be connected to each other.

Furthermore, there is provided a method of producing a module substrate comprising a substrate for mounting an electronic component on the front surface side thereof, and end-face electrodes provided in the outer peripheral edge of the substrate and adapted to be connected to the electronic component, the end-face electrodes each being provided with a solder to be connected to a mother board, which comprises the steps of: forming a plurality of through holes in line in a work substrate, forming an electrode film on the inner wall of each through hole, placing the work substrate on a jig having a plurality of holes having bottom in line such that the through holes are aligned with the holes having bottom, respectively, supplying the solders into the through holes and the holes having bottom so as to be fixed, respectively, cutting the work substrate and the jig along the lines passing through the centers of the respective through holes, and removing the jig from the work substrate, whereby the solders are each provided on the inner side of the substrate with respect to the end-face thereof.

Accordingly, the work substrate having a plurality of through holes formed therein can be placed on the jig, so that the through holes of the work substrate can be aligned with the holes having bottom of the jig, respectively. Furthermore, after the solders are placed into the through holes and the holes having bottom and fixed thereto, the work substrate is cut along the line passing the centers of the through holes. Thereby, the end-face electrodes opening on the end-face side of the substrate can be formed, and by removing the jig, the protuberant portions defined by the solders protruding on the back-surface side of the substrate can be formed.

Moreover, there is provided a method of producing a module substrate comprising a substrate for mounting an electronic component on the front surface side thereof, and end-face electrodes provided in the end faces defining the outer peripheral edge of the substrate and adapted to be connected to the electronic component, the end-face electrodes each being provided with a solder to be connected to a mother board, which comprises the steps of forming a plurality of through holes in line in a work substrate, forming an electrode film on the inner wall of each through hole, forming back-surface electrode films on the back-surface side of the work substrate and being arranged in the peripheries of the respective through holes, forming each of a plurality of solder accommodation holes adjacent to each of the through holes having a semi-circular shape in the work substrate, supplying the solders into the through holes and the solder-accommodation holes from the back-surface side thereof with the front-surface side of the through holes and the solder-accommodation holes is closed, heating the solders to form solder protuberant portions each covering the back-surface electrode, and cutting the work substrate along a line passing through the solder accommodation holes, whereby the solders are each provided on the end-face side of the substrate.

Accordingly, the end-face electrodes and the back-surface electrodes can be formed by forming the solder accommodation holes adjacent to the through holes. Furthermore, the protuberant portions of the solders covering the back-surface electrodes can be provided by supplying the solders into the through holes and the solder accommodation holes from the back-surface side while the front-surface side of the through holes and the solder-accommodation holes is closed, and heating-the solders. By cutting the work substrate along a line passing the solder accommodation holes, the end-face opening grooves opening at the end-faces of the substrate can be provided, and moreover, the solders each including the electrode facing portion and the protuberant portion can be provided in the end-face opening groove.

Furthermore, there is provided a method of producing a module substrate comprising a substrate for mounting an electronic component on the front surface side thereof, and end-face electrodes provided in the outer peripheral edge of the substrate and adapted to be connected to the electronic component, the end-face electrodes each being provided with a solder to be connected to a mother board, which comprises the steps of forming a plurality of through holes in line in a work substrate, forming an electrode film on the inner wall of each through hole, forming back-surface electrode films on the back-surface of the substrate in the peripheries of the through holes, forming each of a plurality of solder accommodation holes adjacent to each of the through holes having a semi-circular shape in the work substrate, cutting the work substrate along a line passing through the solder-accommodation holes, supplying the solders into the through holes and the solder-accommodation holes from the back-surface side thereof with the front-surface side of the through holes and the solder-accommodation holes being closed, and heating the solders to form solder protuberant portions each covering the back-surface electrode, whereby the solders are each provided on the end-face side of the substrate.

Accordingly, the end-face electrodes and the back-surface electrodes can be formed by forming the solder accommodation holes adjacent to the through holes. By cutting the work substrate along a line passing the solder accommodation holes, the end-face opening grooves opening at the end-faces of the substrate can be provided. Furthermore, by supplying the solders into the through holes and the solder accommodation holes from the back-surface side while the front-surface side of the through holes and the solder-accommodation holes is closed, and heating the solders, the protuberant portions of the solders covering the back-surface electrodes can be provided, and moreover, the solders each including the electrode facing portion and the protuberant portion can be provided in the end-face opening groove.

DESCRIPTION OF THE PREFERRED EMBODIMENTS

Figure 1:
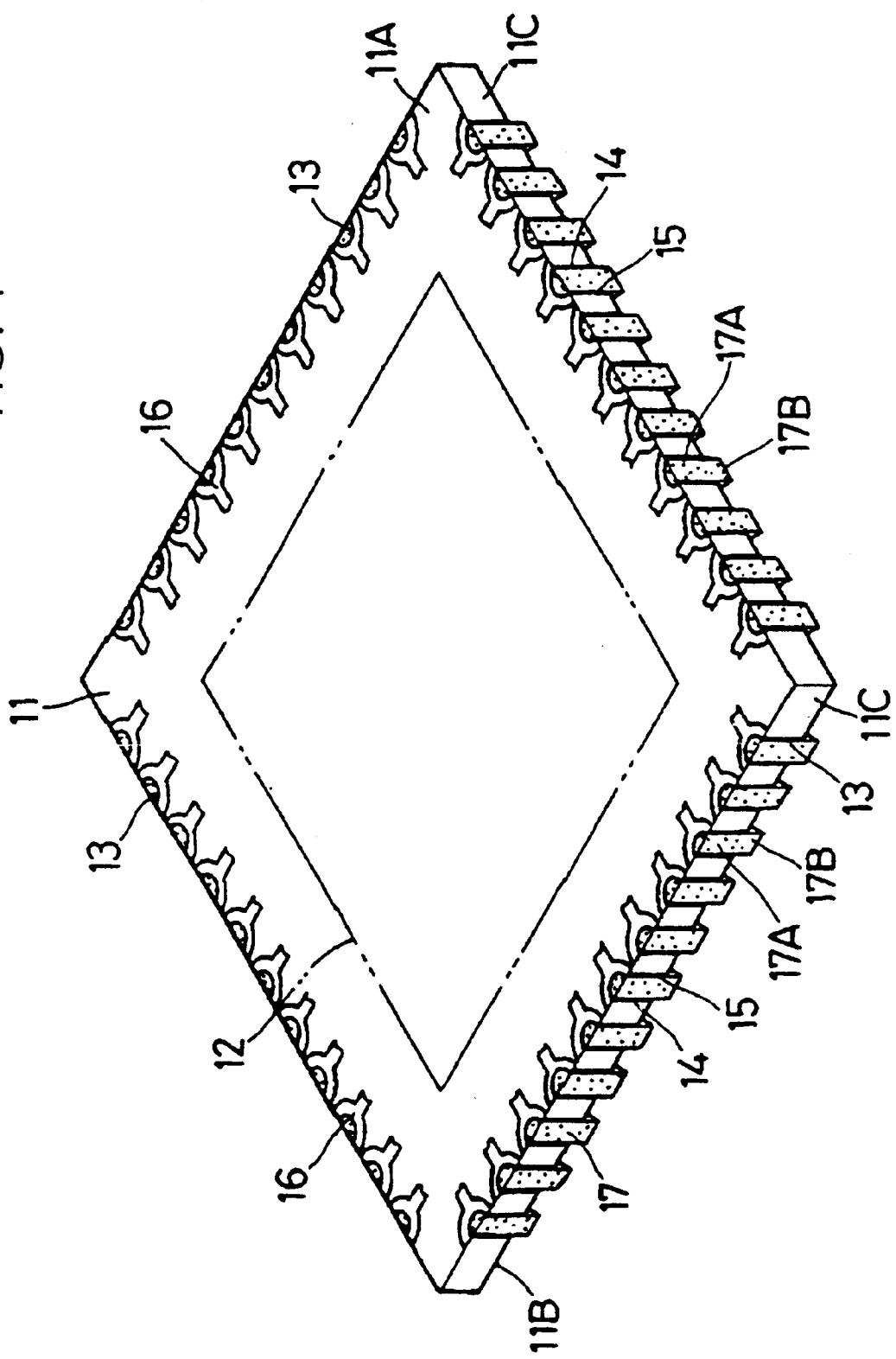
FIG. 1 perspective view of a module substrate according to a first embodiment of the present invention.

Hereinafter, a module substrate according to an embodiment of the present invention will be described with reference to FIGS. 1 to 26.

First, FIGS. 1 to 8 show a module substrate according to a first embodiment of the present invention. In FIGS. 1 to 8, a substrate 11 comprises a laminate formed by alternately laminating, e.g., insulating resin materials and wiring patterns (not shown) made of a conductor to each other. A plurality of end-face through-holes 13, which will be described later, are formed in the outer peripheral edge of the substrate 11. The substrate 11 is formed into a substantially rectangular shape, e.g., with a size of about 30 mm by 30 mm. In the center of the front surface 11A of the substrate 11, an electronic component 12 such a semiconductor IC, an active component, a passive component or the like is mounted. To the back surface 11B, a mother board 5 is joined.

End-face through-holes 13 are formed on the end faces 11C which are composed of four sides defining the outer peripheral edge of the substrate 11. The respective end-face through-holes 13 are comprised of an end-face opening groove 14 and an end-face electrode 15, which will be described later.

Figure 2:
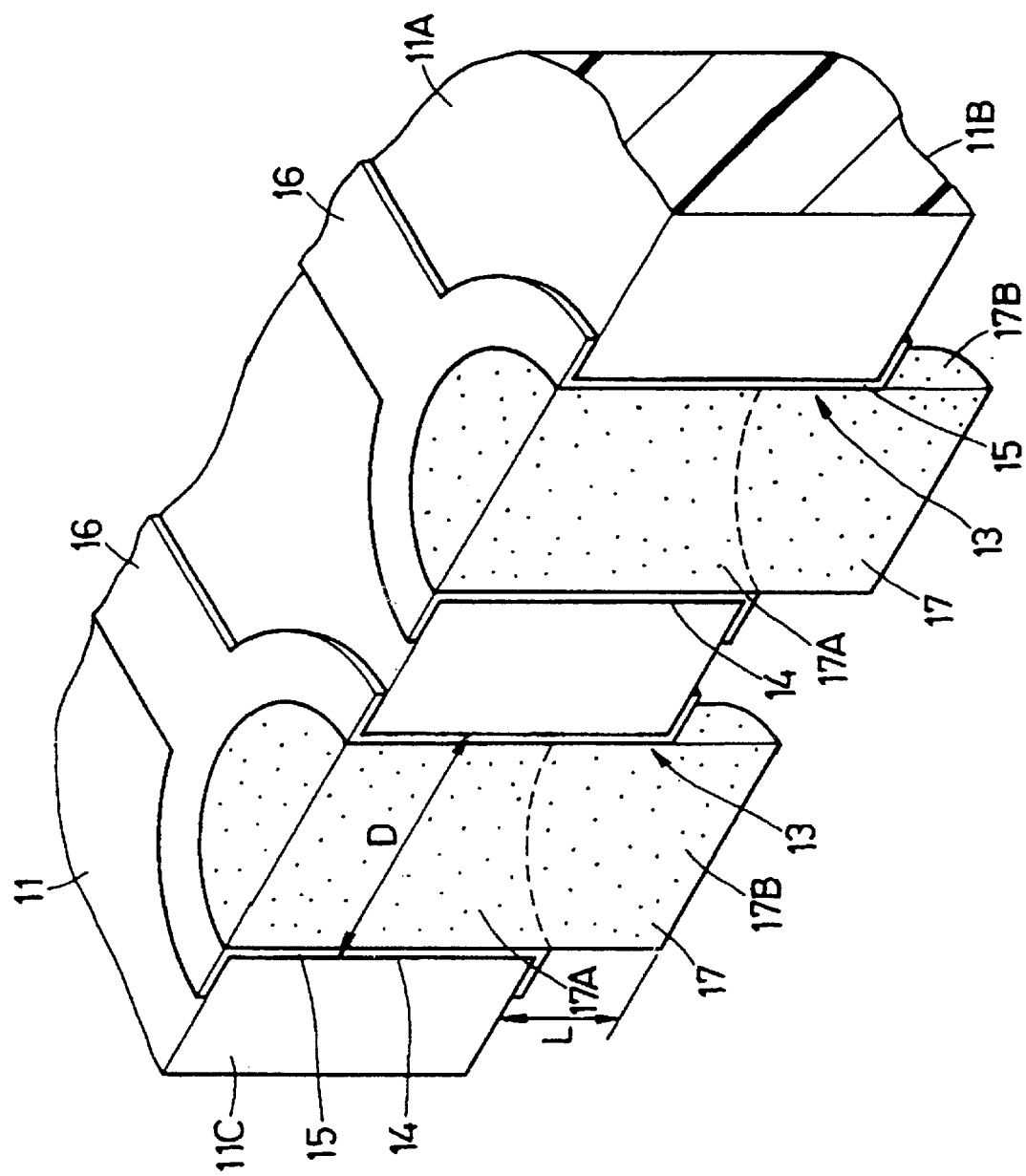
FIG. 2 is a fragmentary enlarged perspective view showing the enlarged end-face electrodes, solders, and so forth of FIG. 1.

The end-face opening grooves 14 are provided in a concave curved-shape in the end-faces 11C of the substrate 11. Each end-face opening groove 14 has a substantially semi-circular shape having an inner diameter D of, e.g., about 1 mm, and is opened at the end-face 11C of the substrate 11, as shown in FIG. 2. The end-face opening groove 14 extends to pass through the substrate 11 in the thickness direction.

End-face electrodes 15 are each provided to extend over the entire inner wall of the end-face opening groove 14. Each end-face electrode 15 is connected to a wiring 16 provided on the front surface 11A of the substrate 11. The end-face electrode 15 is connected via the wiring 16 to an electronic component 12 provided in the center of the substrate 11.

The solders 17 provided in the end-face opening groove 14 have a columnar shape with a substantially semi-circular cross section. Each solder 17 comprises an electrode-facing portion 17A disposed so as to face the end-face electrode 15, and a protuberant portion 17B which extends from the electrode facing portion 17A in the thickness direction of the substrate 11 and protrudes on the back-surface 11B side of the substrate 11. The electrode facing portion 17A contacts the entire surface of the end-face electrode 15. The size L of the protuberant portion 17B protruding from the back surface 11B of the substrate 11 is set, e.g., at about 0.3 to 0.6 mm. The solder 17 is contacted with an electrode pad 6 of the mother board 5 to form a fillet 18, which will be described later, between the end-face electrode 15 and the electrode pad 6.

The module substrate of this embodiment is constructed as described above. Hereinafter, a method of producing the module substrate will be described with reference to FIGS. 3 and 4.

Figure 3:
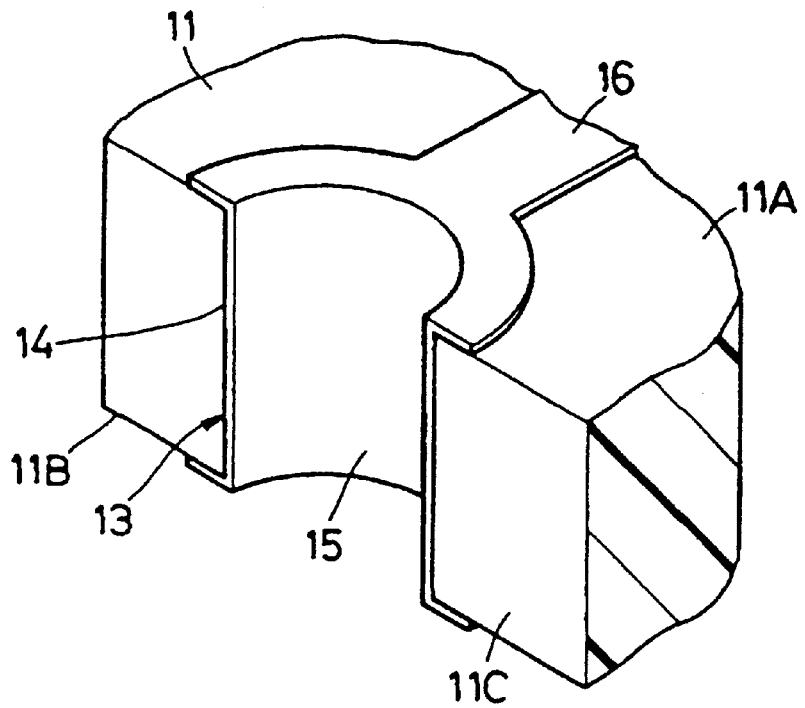
FIG. 3 is a fragmentary enlarged perspective view showing an end-face through-hole comprising an end-face opening groove and an end-face electrode formed on the outer peripheral edge of the substrate.
Figure 4:
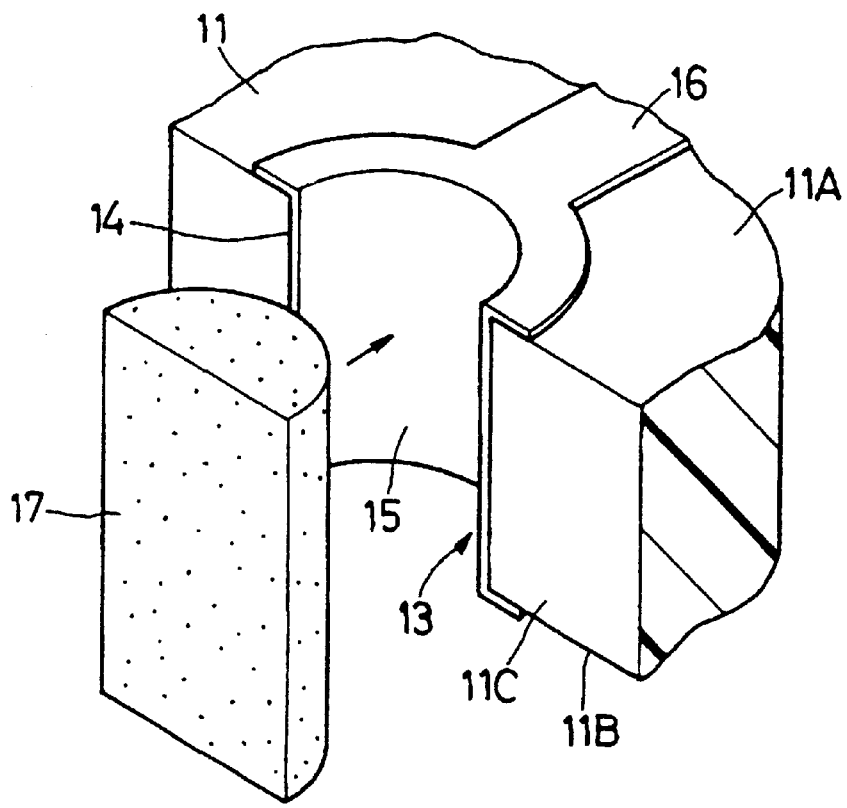
FIG. 4 is a fragmentary enlarged perspective view showing a solder having a columnar shape which is attached to the end-face electrode of the substrate.

First, in the process of forming an end-face electrode, the end-face opening grooves 14 having a substantially semi-circular shape are formed on the outer peripheral edge of the substrate 11. On the inner wall of each end-face opening groove 14, the end-face electrode 15, which is an arch-shaped film, is provided. Thus, in the end faces 11C of the substrate 11, the end-face through-holes 13 are formed as shown in FIG. 3. The end-face through-holes 13 may be formed by cutting through-holes each having a substantially circular opening along the line passing through the centers of the through-holes.

Next, in the process of forming a columnar solder, a long wire-shaped solder having a substantially semi-circular cross-section (not shown), is cut to a length about 0.5 mm longer than the thickness of the substrate 11, whereby columnar-shaped solders 17 are formed. The solder may be formed by casting solder into, e.g., a mold having a substantially semi-circular molding surface.

Finally, in the process of attaching a solder, the solder 17 is pressed against the end-face electrode 15 having the inner wall coated with flux and an organic adhesive. At this time, the solder 17 is arranged such that the end of the solder 17 protrudes about 0.5 mm from the back surface 11B of the substrate 11. Thus, the electrode-facing portion 17A of the solder 17 can be bonded to the end-face electrode 15, and the protuberant portion 17B is fixed to be protruded from the back surface 11B of the substrate 11.

The solder 17, instead of being bonded to the end-face electrode 15 by use of flux, may be press-fitted into the end-face opening groove 14 to be attached to the end-face electrode 15. Alternatively the electrode facing portion 17A of the solder 17 may be heated so that the solder 17 is bonded to the end-face electrode 15.

The module substrate of this embodiment is produced according to the above-described production method. Hereinafter, bonding of this module substrate to the mother board will be described with reference to FIGS. 5 to 8.

Figure 5:
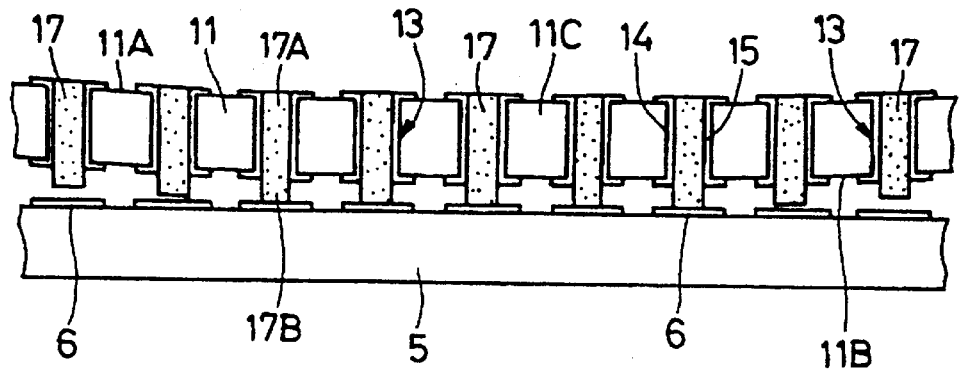
FIG. 5 is a side view showing the module substrate placed to a mother board.

First, similarly to the conventional technique, the module substrate is placed on the mother board 5 and, in this state, is heated. If warpage occurs in the substrate 11 and the mother board 5, solders 17 located at the both ends in a plurality of the solders 17 are separated from the electrode pads 6 on the mother board 5 as shown in FIG. 5.

The solders 17 in contact with the electrode pads of a plurality of the solders 17 are sequentially melted. That is, the solders 17 located in the center of the substrate 11 in the longitudinal direction are melted earlier than the solders 17 located at the both ends in the longitudinal direction of the substrate 11. Thus, the substrate 11 moves down in the direction indicted by arrow B in FIG. 6, due to its own weight, so that the solders 17 positioned at the both ends of the substrate 11 are contacted with the electrode pads 6 of the mother board 5.

Figure 6:
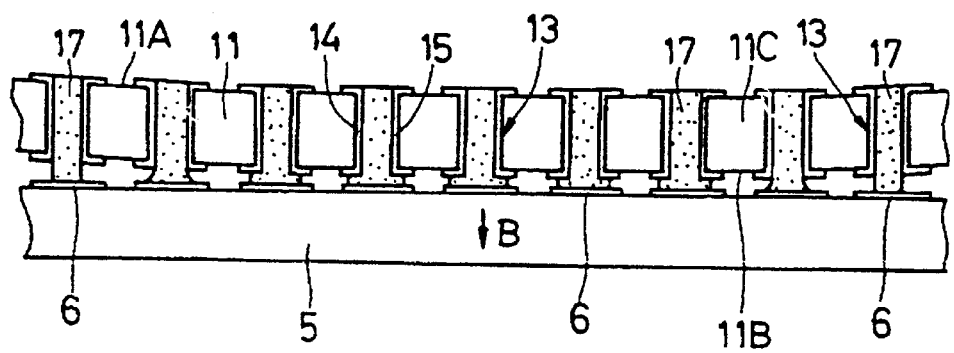
FIG. 6 is a side view showing the solders melted after the substrate is placed onto the mother board.
Figure 7:
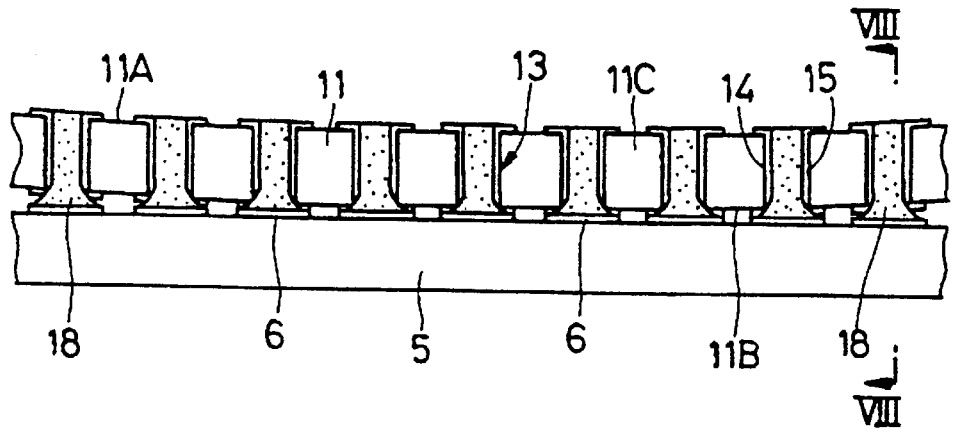
FIG. 7 is a side view showing the module substrate bonded to the mother board after the solders are melted.
Figure 8:
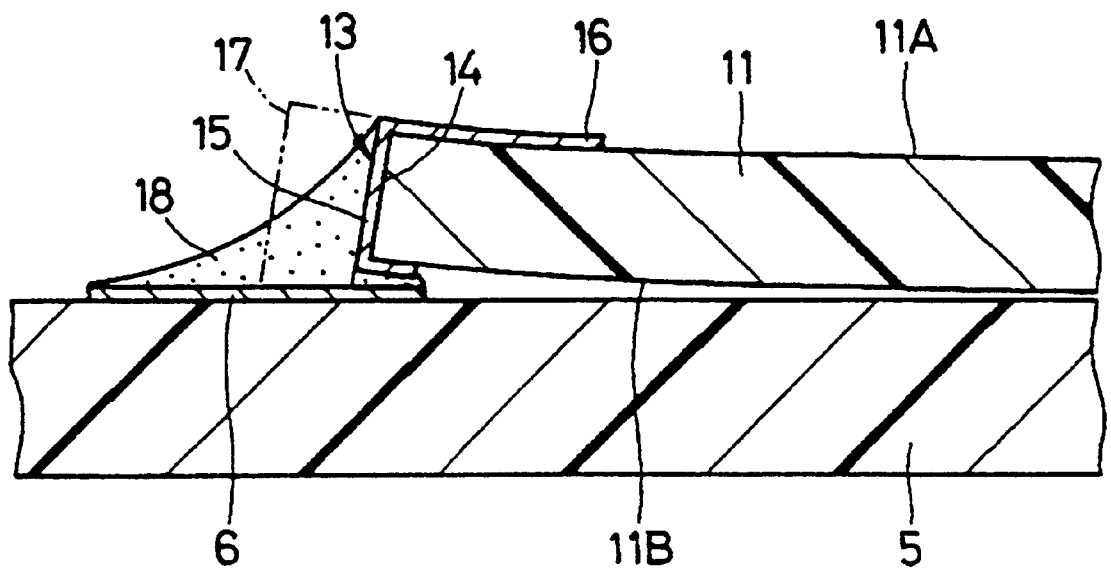
FIG. 8 is an enlarged cross sectional view, taken from the direction indicated by arrow VIII—VIII in FIG. 7.

As a result, for example, even if a gap of about 0.1 to 0.4 mm is generated between the end-face electrodes 15 of the substrate 11 and the electrode pads 6 of the mother board 5, as in the case in which a warpage is generated in the substrate 11, the tips of all of the solders 17 finally come into contact with the electrode pads 6 of the mother board 5 as shown in FIG. 6. Thus, the end-face electrodes 15 of the substrate 11 can be connected to the electrode pads 6 of the mother board 5 through the melted solders 17. That is, fillets 18 can be formed between the end-face electrodes 15 and the electrode pads 6, as shown in FIGS. 7 and 8.

In this embodiment, the solders 17 are formed so as to protrude on the back surface 11B side of the substrate 11. Accordingly, even if a warpage occurs in the substrate 11 or the like so that a gap is generated between the end-face electrodes 15 of the substrate 11 and the electrode pads 6 of the mother board 5, the solders 17 protruding on the back surface 11B side of the substrate 11 can connect the end-face electrodes 15 and the electrode pads 6 to each other to form fillets 18 between them.

Each of the solders 17 comprises the electrode facing portion 17A positioned in the end-face opening groove 14 and attached to the end-face electrode 15, and the protuberant portion 17B formed so as to protrude from the electrode-facing portion 17A to the back-surface 11B side of the substrate 11. Accordingly, a gap between the end-face electrode 15 and the electrode pad 6 can be filled with the protuberant portion 17B, and the fillet 18 can be formed between the end-face electrode 15 and the electrode pad 6 by melting the electrode facing portion 17A of the solder 17 provided in the end-face opening groove 14.

Figure 9:
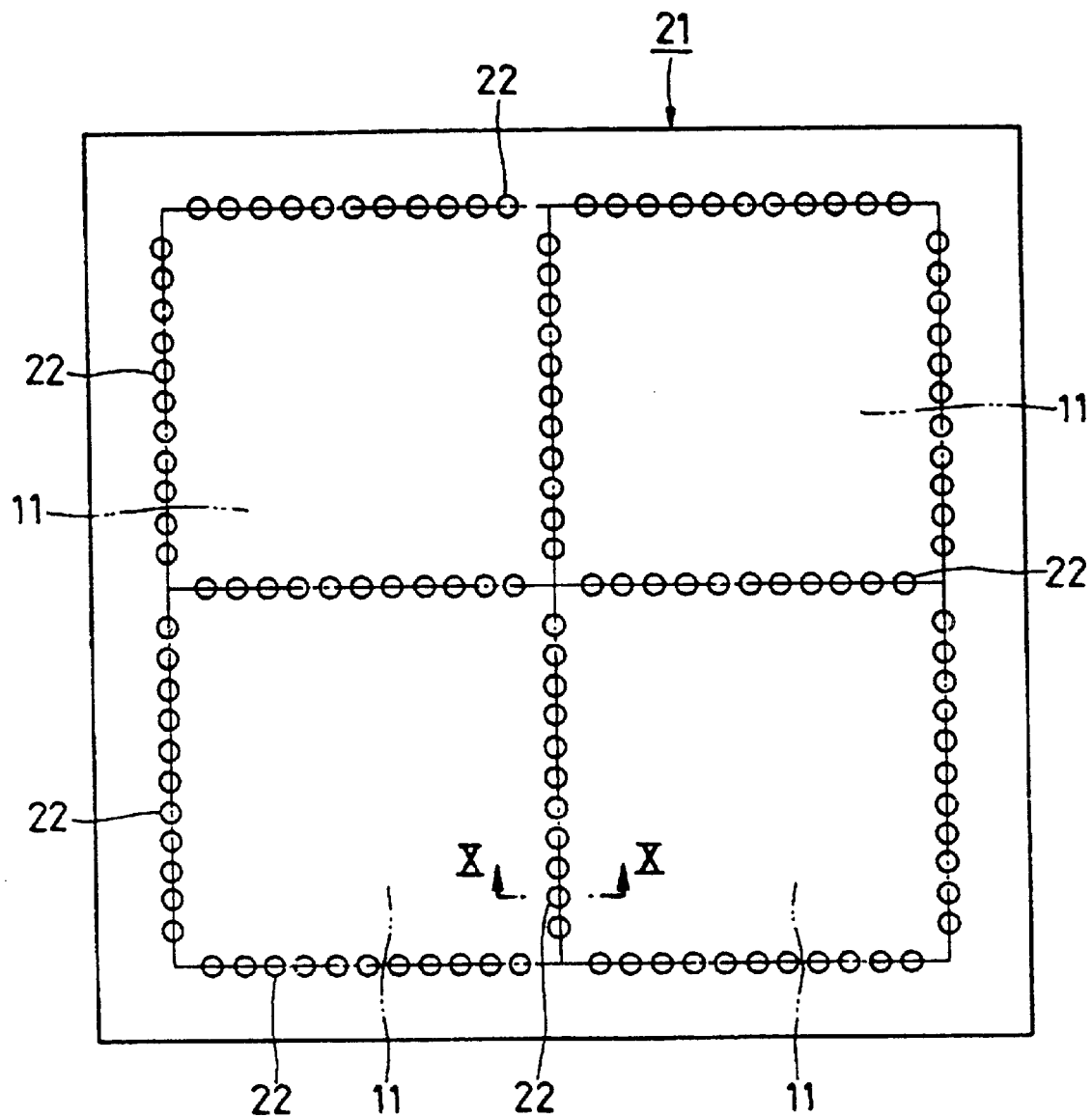
FIG. 9 is a plan view of a work substrate according to a second embodiment of the present invention, provided with a plurality of through holes.

Next, FIGS. 9 to 13 show a method of producing a module substrate according to a second embodiment of the present invention. A characteristic of this embodiment lies in that the solders are attached to the end-face electrodes by means of a jig. Similar components in the first and second embodiments are designated by the same reference numerals, and repeated description thereof is omitted. In this embodiment, an example is described in which four module substrates are produced from one work substrate as shown in FIG. 9.

First, in the process of forming a through hole, a work substrate 21 for producing, e.g., four module substrates, is punched by means of a punch having a circular shape, so that a plurality of through holes 22 are formed in line. Each through hole 22 has, e.g., an inner diameter of about 1 mm.

Figure 10:
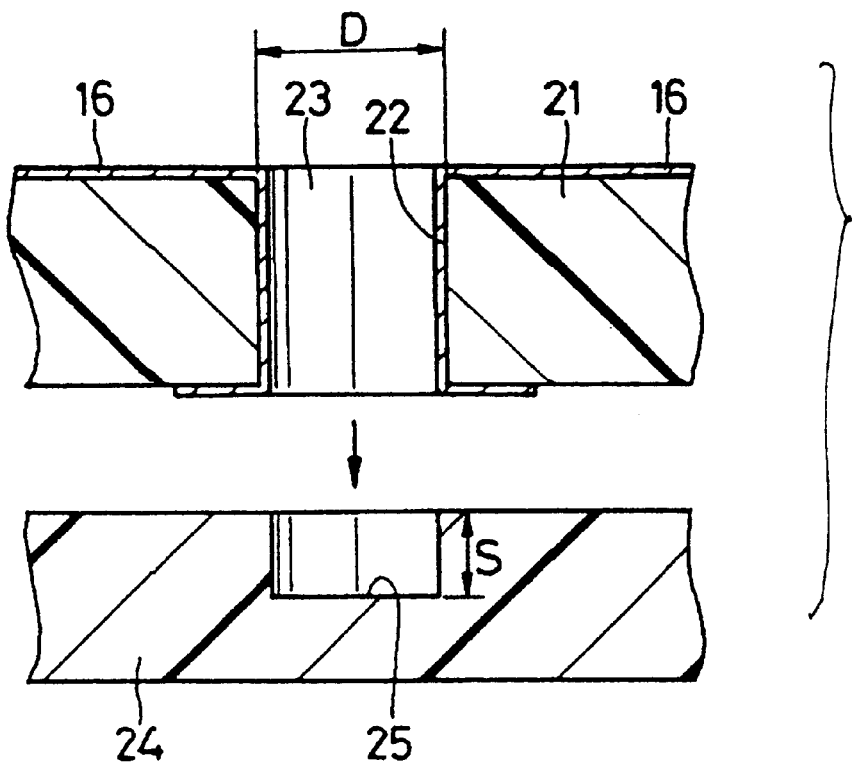
FIG. 10 is a fragmentary enlarged cross sectional view showing the work substrate having an electrode film formed on the through hole which is placed on a jig, taken from the direction of X—X indicated by arrow in FIG. 8.

Next, in the process of forming an electrode film, each through hole 22 is treated by plating or the like, as shown in FIG. 10, whereby an electrode film 23 is formed on the entire inner wall of the through hole 22. Thereafter, a mask such as a photo-resist or the like is formed on the front surface of the work substrate 21, and etching is carried out, whereby a wiring 16 is formed so as to be connected to the electrode film 23.

Next, in the process of placing a substrate, the work substrate 21 is placed on a jig 24 made of a resin material comprising an epoxy resin or the like kneaded with glass. The jig 24 is provided with a plurality of holes 25 having bottom which are arranged in line to correspond to the through holes 22. The through holes 22 are each aligned with the holes 25 having bottom, respectively. For each holes 25 having bottom, the depth S thereof is set at about 0.3 to 0.6 mm depending on the protuberance portions 17B of the solders 17.

Figure 11:
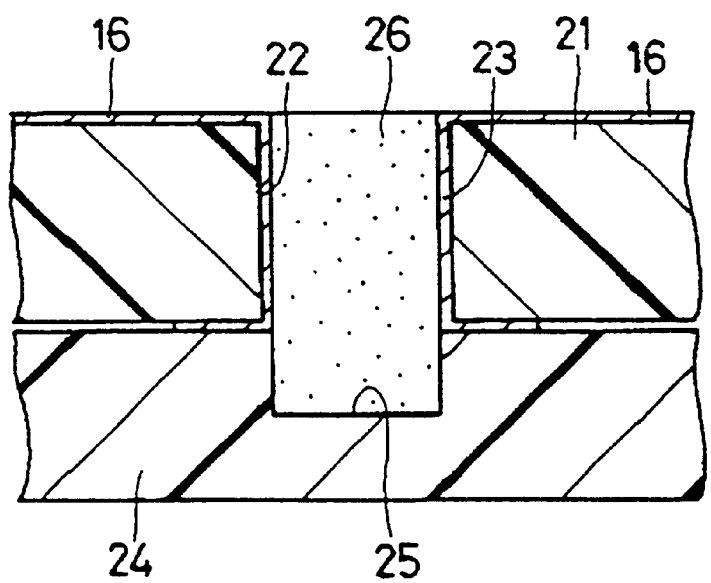
FIG. 11 is a fragmentary enlarged cross sectional view showing a solder filled in the through hole and the bottomed hole shown in FIG. 10.

Next, in the process of filling a solder, melted solders 26 are accommodated (filled) in the through holes 22 and the holes 25 having bottom, as shown in FIG. 11. After this, the work substrate 21 or the like is cooled, whereby the solders 26 having a substantially columnar shape are bonded and fixed to the electrode films 23 in the through holes 22.

Finally, in the process of cutting a substrate, the work substrate 21 and the jig 24 are cut along the lines passing through the centers of the through holes 22 having the solders 26 filled therein, by means of a diamond cutter, in a cross-cut pattern as viewed from the front surface side shown in FIG. 9.

Figure 12:
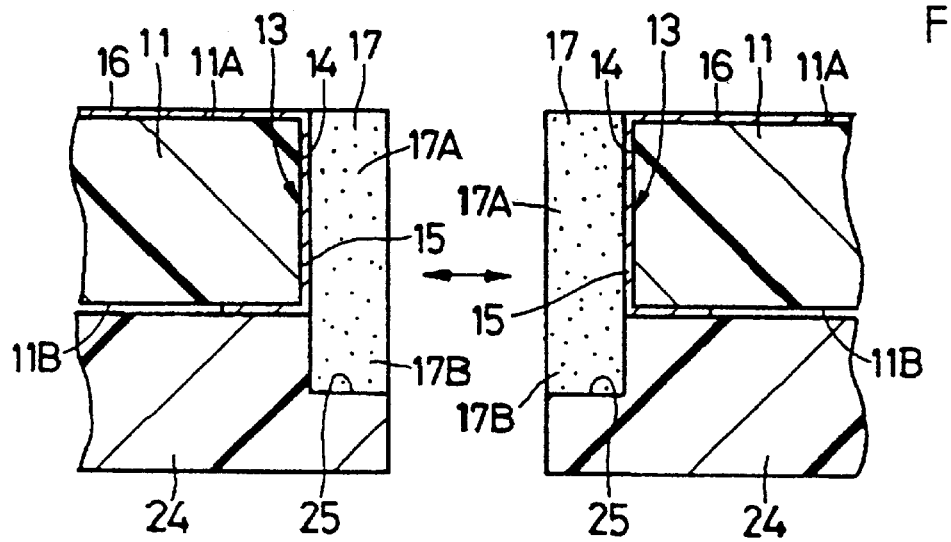
FIG. 12 is a fragmentary enlarged cross sectional view showing the work substrate and the jig of FIG. 11 cut, respectively.
Figure 13:
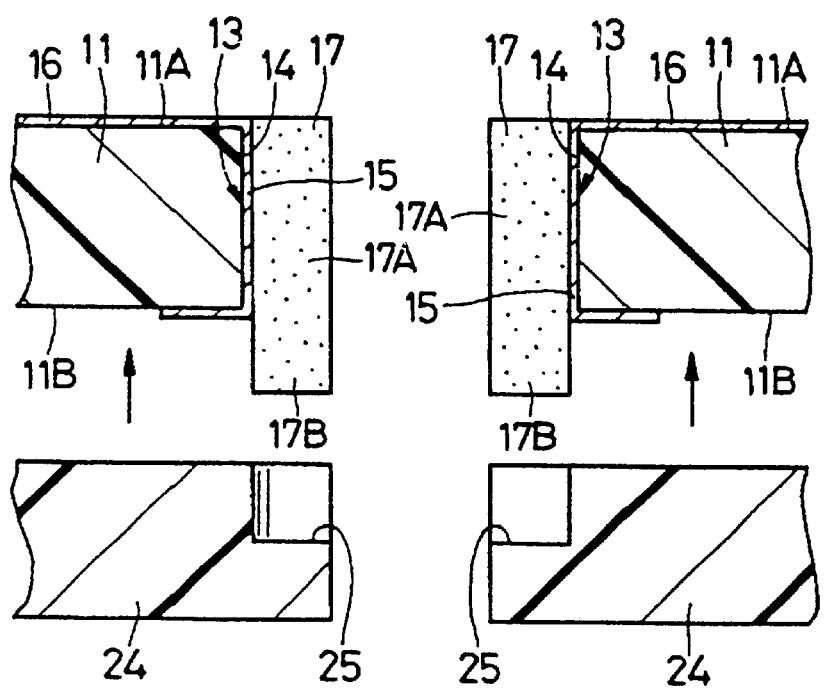
FIG. 13 is a fragmentary enlarged cross sectional view showing the jig removed from the work substrate of FIG. 12.

Thus, the substrates 11 are formed by cutting the work substrate 21 as shown in FIG. 12. A plurality of the end-face electrodes 15 (end-face through-holes 13) each having a substantially semi-arch shape are formed in the end-faces 11C of the substrate 11, and moreover, the solders 17 having a columnar shape with a semi-circular cross section and protruding on the back-surface 11B side of the substrate 11 are attached to the end-face electrodes 15. Thereafter, as shown in FIG. 13, the substrate 11 is removed from the jig 24, whereby four module substrates can be simultaneously produced.

As described above, according to such a production method, four module substrates 11 each having a plurality of the end-face electrodes 15 on the end-faces 11C of the substrate 11 can be simultaneously produced. Moreover, the solders 17 protruding on the back-surface 11B side of the substrate 11 can be easily fixed to the end-face electrodes 15, respectively. Therefore, the production efficiency of the module substrate is improved, and the manufacturing cost can be reduced.

Figure 14:
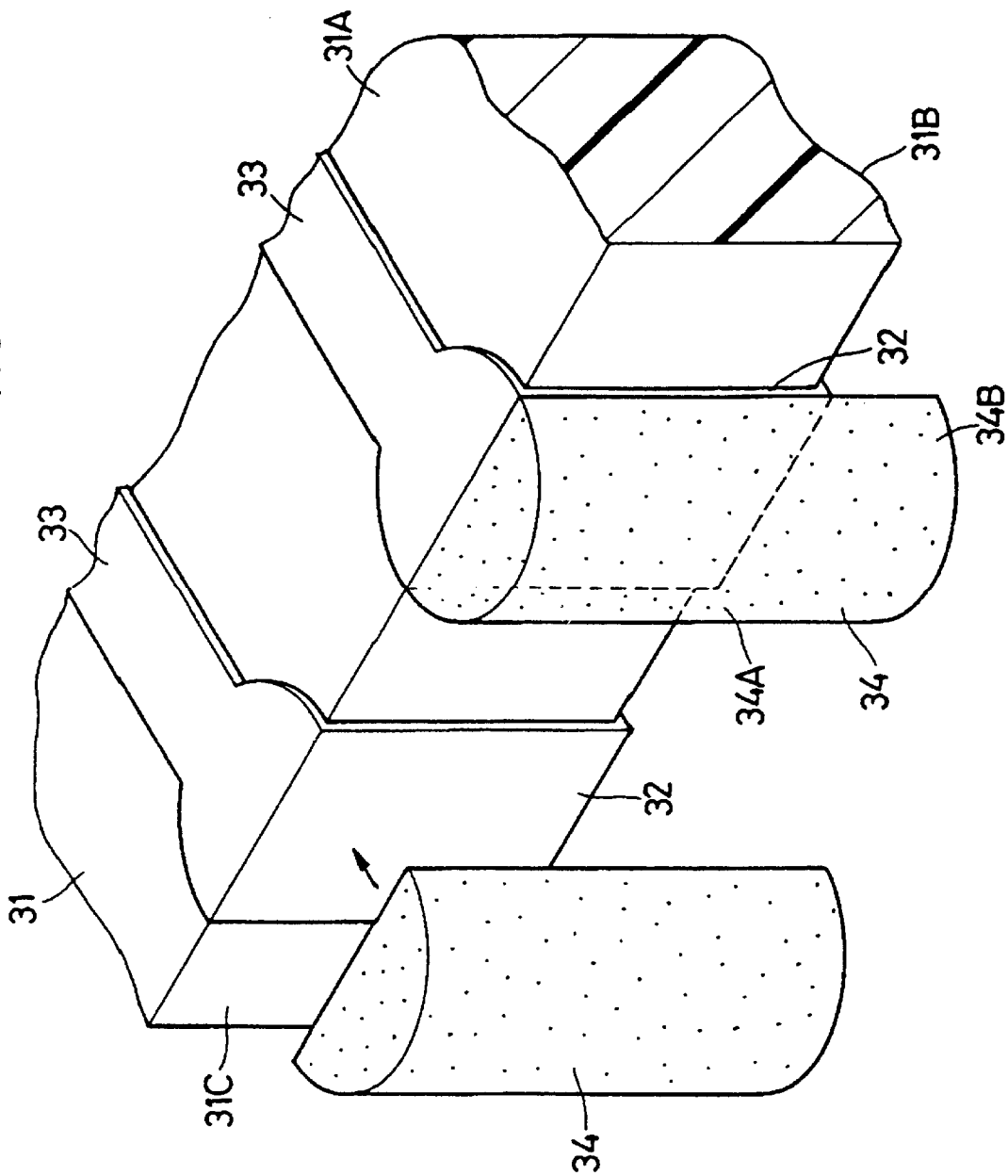
FIG. 14 is a fragmentary enlarged cross sectional view showing a module substrate according to a third embodiment of the present invention.

Next, FIG. 14 shows a module substrate according to a third embodiment of the present invention. A characteristic of this embodiment lies in that plane electrodes are formed directly on the end-faces of the substrate, and solders are fixed to the plane electrodes, respectively. In this embodiment, similar components in the first and the present embodiments are designated by the same reference numerals, and repeated description thereof is omitted.

In this embodiment, a substrate 31 has a substantially rectangular shape similar to that of the first embodiment, and is formed from a resin material.

Plane electrodes 32 as the end-face electrodes are formed directly on the end-faces 31C of the substrate 31. The plane electrodes 32 are provided on the end-faces 31C of the substrate 31 in a plane shape and are elongated in the thickness direction of the substrate 31. The plane electrodes 32 are connected to wirings 33 formed on the front surface 31A of the substrate 31.

Solders 34 having a substantially semi-circular cross section are attached to the plane electrodes 32, respectively. The flat plane in each solder 34 is bonded to the plane electrode 32, and the arc-shaped portion of the solder 34 constitutes an end-face protuberant portion 34A which protrudes from the end-face 31C of the substrate 31. Furthermore, the solder 34 is elongated along the plane electrode 32 toward the back-surface 31B side of the substrate 31, and the top portion thereof constitutes a protuberant portion 34B which protrudes on the back-surface 31B side of the substrate 31.

According to the present embodiment constituted as described above, the same operation and working-effects as those of the first embodiment can be obtained. In this embodiment, the plane electrodes 31 are formed directly on the end-faces 31C of the substrate 31. Therefore, through hole work or the like of the substrate 31 can be omitted. Fillets can be formed on the end-faces 31C of the substrate 31. The shape and size of each fillet can be conveniently confirmed visually. Bonding of the plane electrodes 32 to the electrode pads of the mother board carried out by means of the solders 34 can be easily confirmed.

Furthermore, the end-face protuberant portion 34A made of much amount of the solder 34 protruding from the end-faces 31C of the substrate 31 is provided on the plane electrode 31. For this reason, the plane electrodes 32 of the substrate 31 and the electrode pads of the mother board, even if a gap is formed between them, can be connected to each other without shortage of the solders 34.

Figure 15:
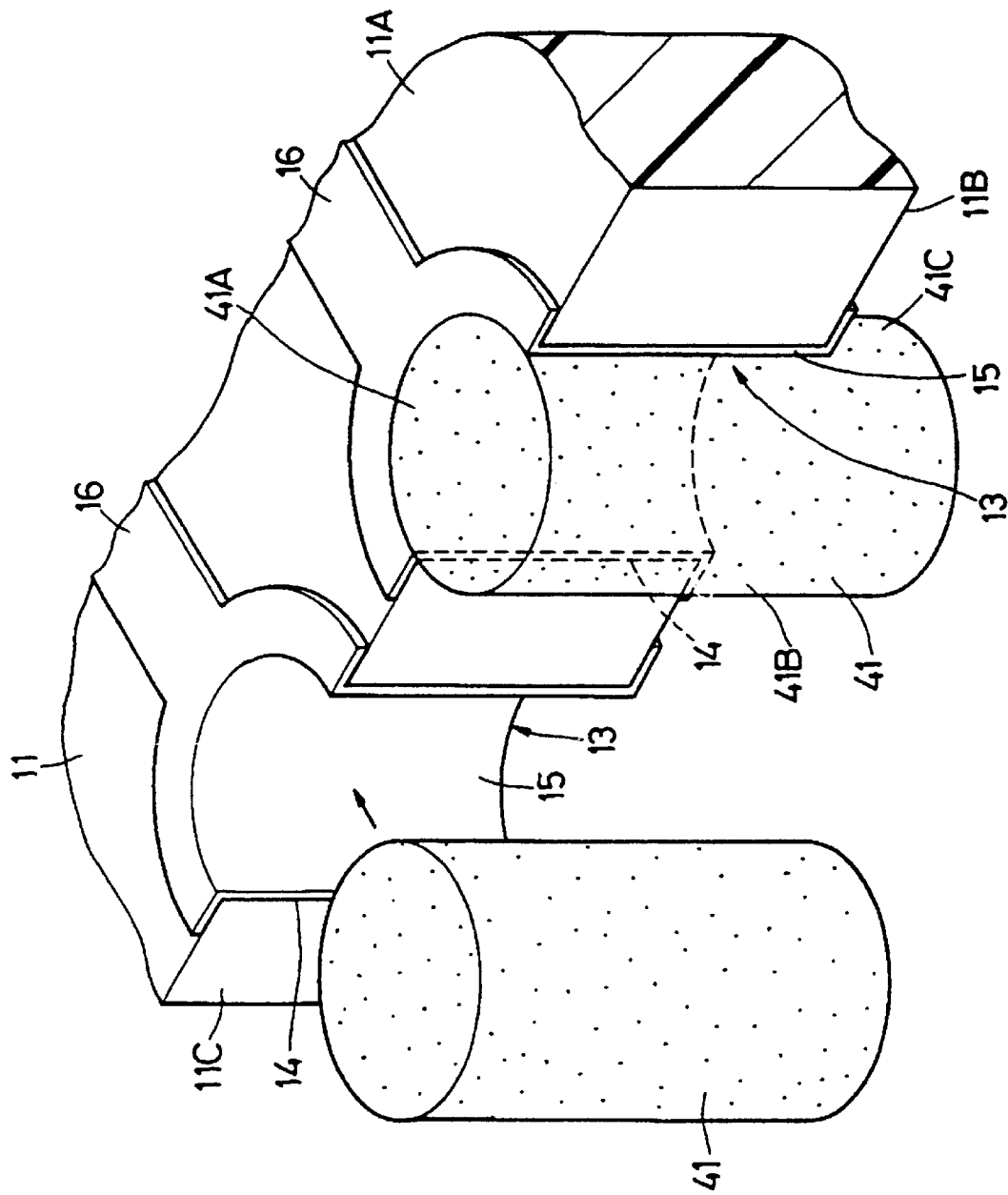
FIG. 15 is a fragmentary enlarged cross sectional view showing a module substrate according to a fourth embodiment of the present invention.
Figure 16:
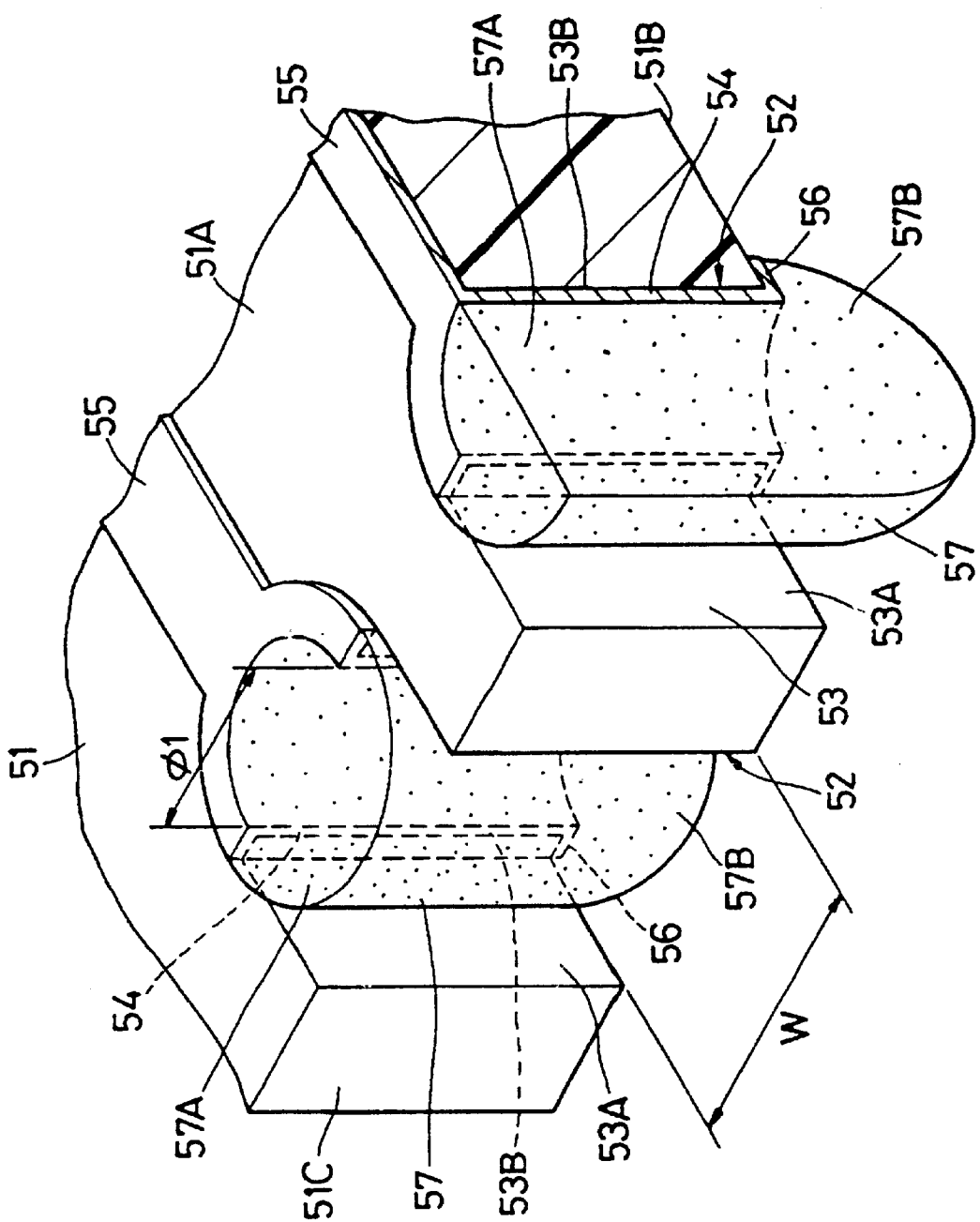
FIG. 16 is a fragmentary enlarged cross sectional view showing a module substrate according to a fifth embodiment of the present invention.

Next, FIG. 15 shows a fourth embodiment of the present invention. A characteristic of this embodiment lies in that each solder faces the end-face electrode on the inner side of the substrate with respect to the end-face, and moreover, a part of the solder is protruded outward of the end-face. Similar components in this embodiment and the above-described first embodiment are designated by the same reference numerals, and repeated description is omitted.

In this embodiment, solders 41 are each formed into a substantially columnar shape. In each solder 41, an electrode facing portion 41A is positioned in the end-face opening groove 14 and faces the end-face electrode 15, an end-face protuberant portion 41B protrudes outwardly of the end-face 11C of the substrate 11, and a protuberant portion 41C protrudes on the back-surface 11B side of the substrate 11.

Thus, according to the present embodiment constituted as described above, nearly the same operation and working-effect as that of the first embodiment can be obtained.

Next, FIGS. 16 to 24 show a fifth embodiment of the present invention. A characteristic of this embodiment lies in that on the back surface of a substrate, back-surface electrodes positioned are provided in the peripheries of end-face opening grooves and connected to end-face electrodes, and solders are protruded on the back-surface side of the substrate, covering the back surface electrodes.

In this embodiment, a substrate 51 having a substantially rectangular shape similar to that in the first embodiment, is formed from a resin material.

End-face through holes 52 are provided on the end-faces 51C of the substrate 51. Each end-face through-hole 52 comprises an end-face opening groove 53, an end-face electrode 54, and a back-surface electrode 56 which will be described later.

The end-face opening grooves 53 are formed so as to define curved concavities in the end-faces 51C of the substrate 51. A solder-accommodating portion 53A extends substantially linearly from the end-face 51C of the substrate 51 at a constant width W. A solder 57 is provided in the solder accommodating portion 53A. Further, the solder 57 is provided in an electrode-formation portion 53B having a substantially semi-circular shape. Each end-face opening grooves 53 comprises the solder-accommodating portion 53A and the electrode-formation portion 53B continuously linked to the solder-accommodating portion 53A to accommodate the solder 57. Since the inner diameter φ1 of the electrode-formation portion 53B is set to be smaller than the width W of the solder-accommodating portion 53A, a step portion is defined between the solder-accommodating portion 53A and the electrode-formation portion 53B. The end-face opening groove 53 extends through the substrate 11 in the thickness direction.

End-face electrodes 54 are provided in the electrode formation portions 53B of the end-face opening portions 53, respectively. Each end-face electrode 54 is formed into substantially an arch shape, covering the inner wall of the electrode formation portion 53B. The end-face electrode 54 is connected to a wiring 55 provided on the front surface 51A of the substrate 51, and connected via the wiring 55 to an electronic component provided in the center of the substrate 51.

Back-surface electrodes 56 are provided in the peripheries of the end-face opening grooves 53 on the back-surface 51B of the substrate 51. Each back-surface electrode 56, having a substantially semi-arch shape, is provided in the periphery of the electrode formation portion 53B, in connection to the end-face electrode 54. The outer diameter φ2 of the back-surface electrode 56 is equal to or less than the width W of the solder accommodation portion 53A (φ2≦W), for example (see FIG. 19).

Solders 57 having a substantially semi-circular shape, are disposed in the respective end-face opening grooves 53. Each solder 57 comprises an electrode facing portion 57A positioned so as to face the end-face electrode 54, and a protuberant portion 57B which is elongated in the thickness direction of the substrate 51 from the electrode-facing portion 57A to protrude from the back-surface 51B and to cover the back-surface electrode 56. Furthermore, the electrode facing portion 57A contacts with the entire surface of the end-face electrode 54. The protuberant portion 57B, having a substantially hemispherical shape, protrudes on the back-surface 51B side of the substrate 51.

The module substrate of this embodiment is configured as described above. Next, a method of producing the module substrate will be described with reference to FIGS. 17 to 24.

Figure 17:
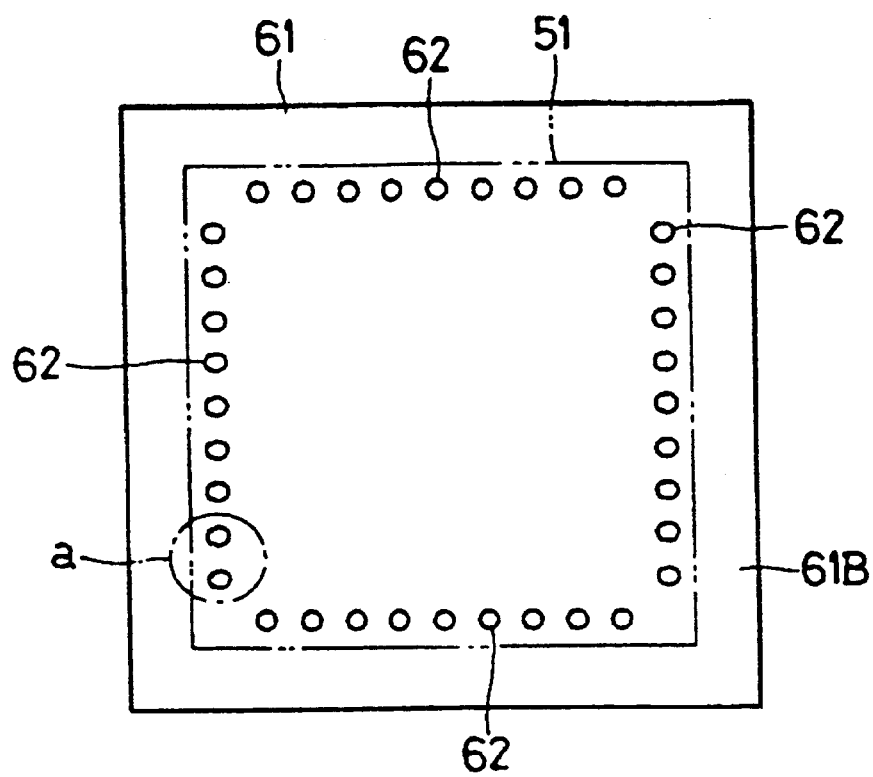
FIG. 17 is a bottom view showing the work substrate according to the fifth embodiment, provided with a plurality of through holes, taken from the bottom side.

In this embodiment, one module substrate is formed from one work substrate, for example, as shown in FIG. 17.

First, as shown in FIG. 17, in the process of forming a through hole a work substrate 61 is punched by means of a circular punch to form, e.g., one module substrate, whereby a plurality of through holes 62 are formed in line (in a frame shape). In this case, the inner diameter of each through hole 62 is set at substantially the same value as the inner diameter φ1 of the electrode formation portion 53B.

Figure 18:
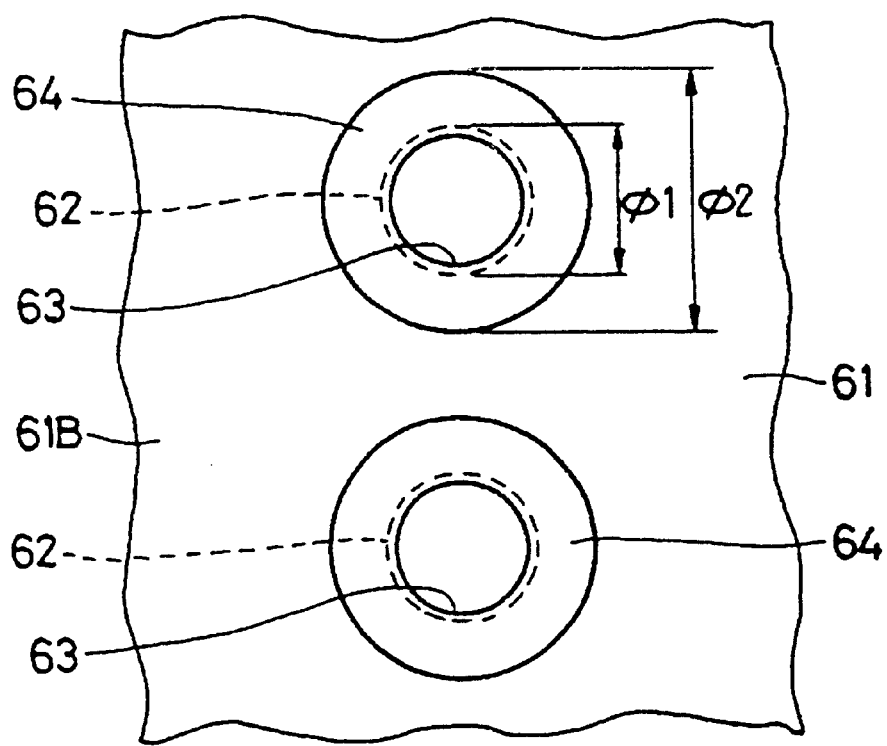
FIG. 18 is a fragmentary enlarged bottom view showing a portion "a" in FIG. 17 in which the electrode films are formed on the through holes, and the back-surface-electrode films are formed on the back-surface side of the work substrate.

Next, as shown in FIG. 18, in the process of forming an electrode film for example, the through holes 62 are plating-treated or the like, so that electrode films 63 are formed on the entire inner walls of the through holes 62, respectively. Thereafter, a mask such as a photoresist or the like is formed on the front surface 61A of the work substrate 61, and etching is carried out, whereby wirings 55 connected to the electrode films 63 are formed. Further, on the back-surface 61B of the work substrate 61, back-surface electrodes 64 are provided in the peripheries of the through holes 62 to be connected to the electrode films 63. In this case, the outer diameter of the respective back-side electrode films 64 is set at substantially the same value as the outer diameter φ2 of the respective back-surface electrodes 56.

Figure 19:
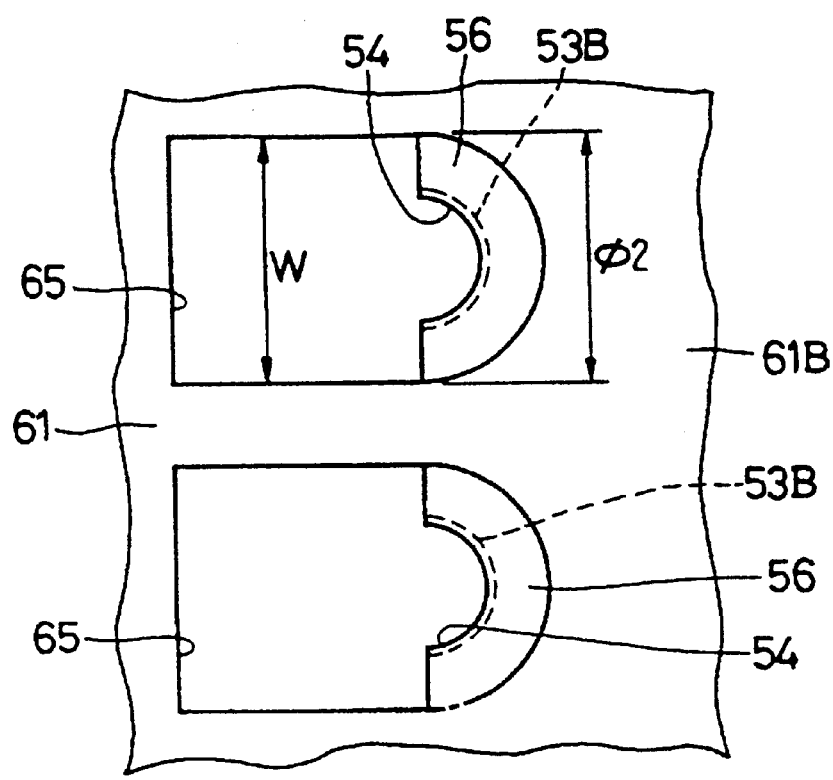
FIG. 19 is a fragmentary enlarged bottom view showing solder accommodation holes formed in the work substrate of FIG. 18.

Next, as shown in FIG. 19 in the process of forming a solder accommodation hole, the work substrate 61 is punched by means of a rectangular punch, so that substantially rectangular solder-accommodation holes 65 adjacent to the respective through holes 62 are formed. In this case, Then, each solder accommodation hole, 65 is formed so as to cut each through hole 62 to substantially half thereof, whereby the electrode formation portion 53B having a substantially semi-circular shape and the end-face electrode 54 are formed. The width of the solder accommodation hole 65 is set at substantially the same value as the width W of the solder accommodation portion 53A. Thus, on the back-surface 61B of the work substrate 61, the substantially semi-circular back-surface electrodes 56 are formed. In order to prevent the generation of burrs in the back-surface electrode 56, both of the edges in the width direction of the solder accommodation hole 65 are positioned so as to contact at least with the outermost periphery of the back-surface electrode 56, or width of the hole 65 is equal to the diameter of the electrode 56. Otherwise, usually both of the edges in the width direction of the solder accommodation hole 65 is positioned on the outer side in the radial direction of the outermost periphery of the back-surface electrode 56, or width of the hole 65 is greater than the diameter of the electrode 56.

Figure 20:
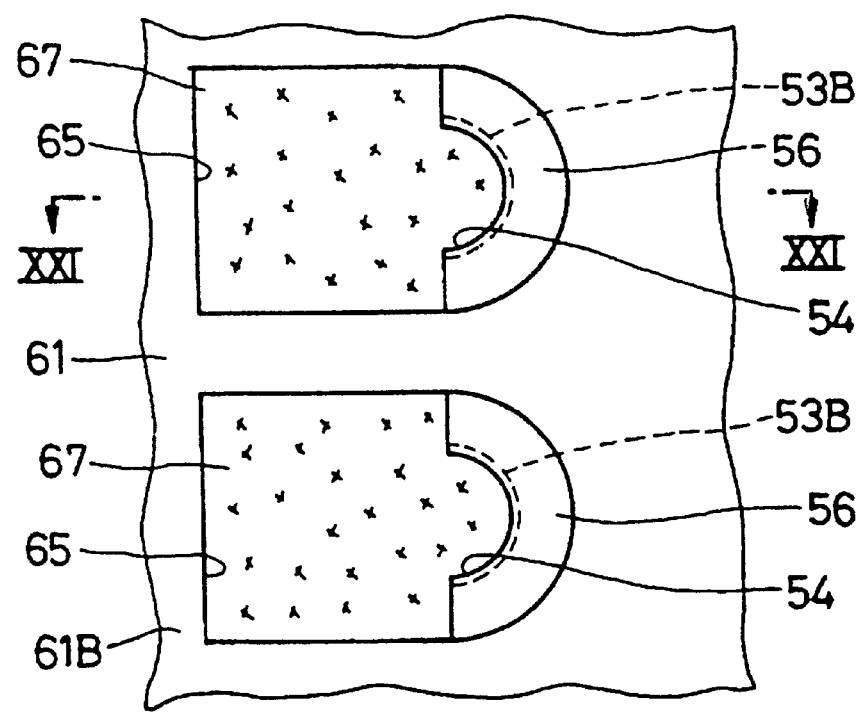
FIG. 20 is a fragmentary enlarged bottom view showing solder paste placed into the solder accommodation holes of FIG. 19.
Figure 21:
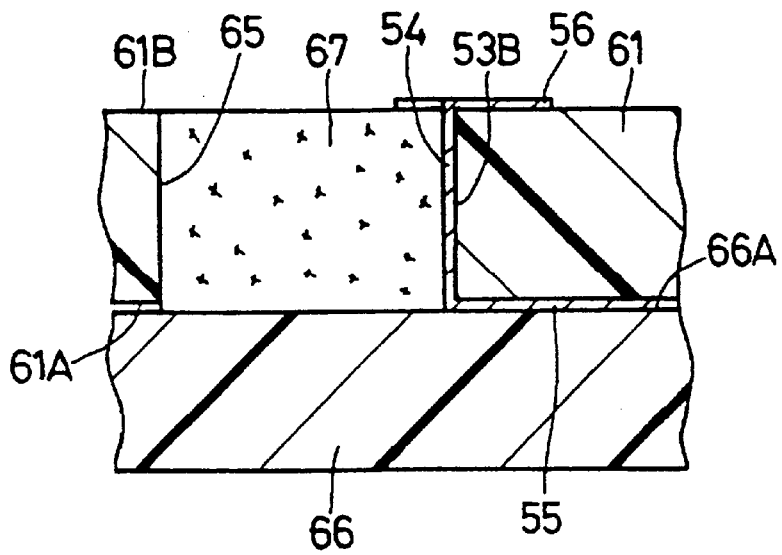
FIG. 21 is a fragmentary enlarged cross sectional view taken from the direction indicated by arrow XXI—XXI in FIG. 20.

Next, as shown in FIGS. 20 and 21, in the process of accommodating a solder the work substrate 61 is placed on a flat-plate jig 66 made of a heat resistant resin material or the like. In this case, the work substrate 61 is overlaid on the jig 66 such that the front surface 61A of the work substrate 61 faces the front surface 66A of the jig 66 (the work substrate 61 is placed face down). Thereafter, a solder paste 67 is supplied into the solder accommodation hole 65 and the electrode formation portion 53B from the back-surface 61B side of the work substrate 61. A fine granular solder, instead of the solder paste 67, may be supplied into the solder accommodation hole 65 and the electrode formation portion 53B.

Figure 22:
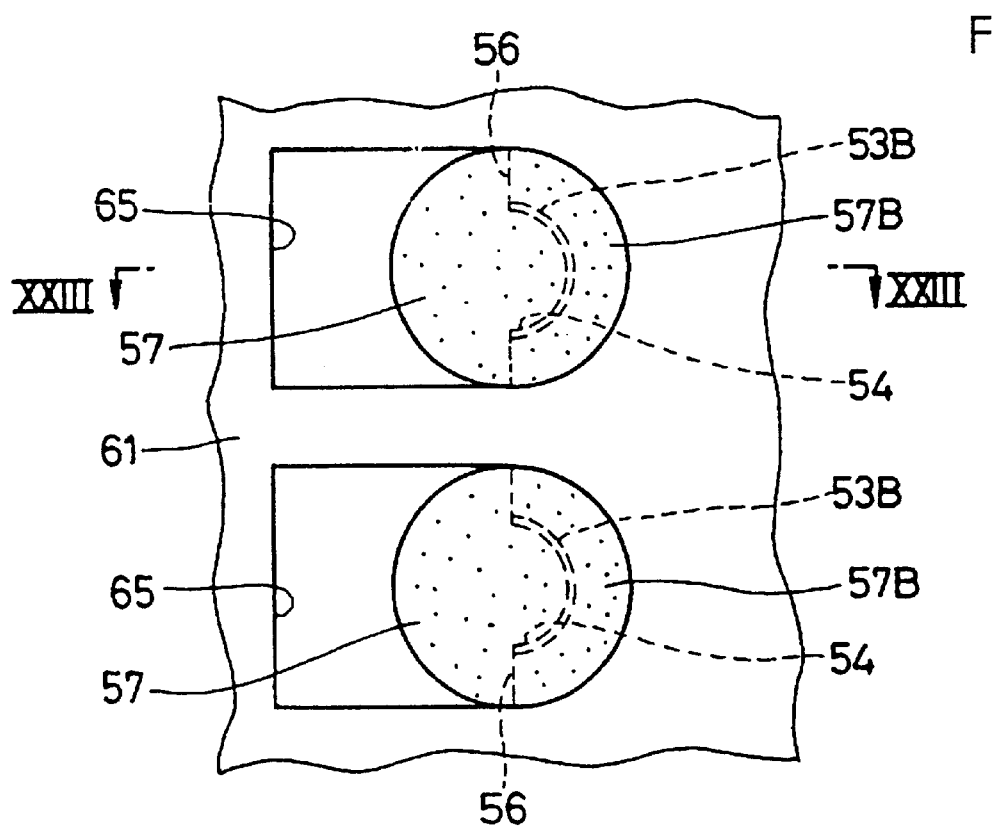
FIG. 22 is a fragmentary enlarged bottom view showing the work substrate of FIG. 20 after heating.
Figure 23:
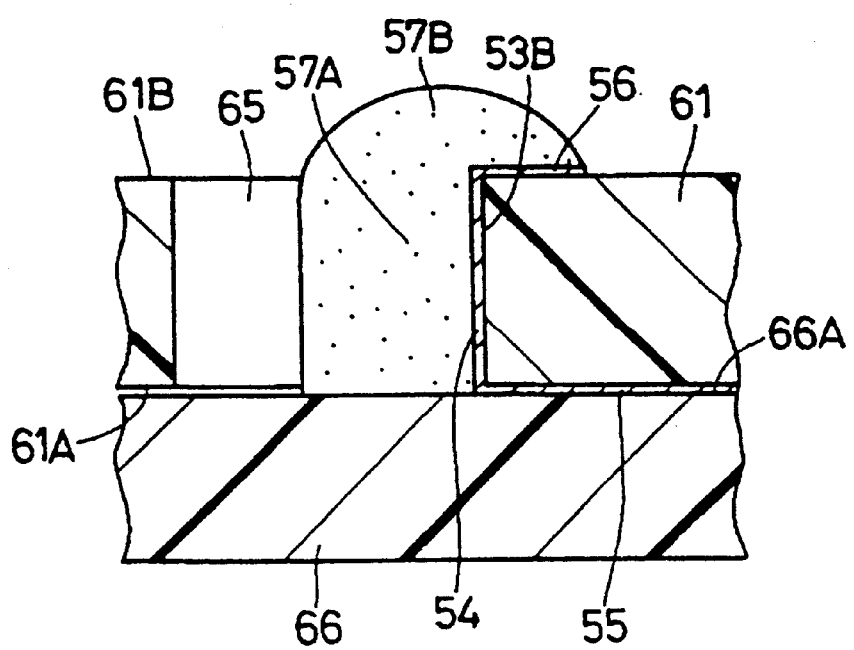
FIG. 23 is a fragmentary enlarged cross sectional view taken from the direction indicated by arrow XXIII—XXIII in FIG. 22.

Next, as shown in FIGS. 22 and 23 in the process of heating a substrate, the work substrate 61 and the jig 66 are heated in the state in which the solder paste 67 is filled in the solder accommodation hole 65 and the electrode formation portion 53B. Thereby, the solder paste 67 is melted, and simultaneously, the melted solder 67 is deformed into a substantially columnar shape in the solder accommodation hole 65, due to surface tension. Then, the melted solder 67 is raised up onto the back-surface electrode 56 with a substantially hemispherical shape, due to bonding properties of the melted solder 67 to the end-face electrode 54 and the back-surface electrode 56. Thereafter, the work substrate 61 or the like is cooled, so that the substantially columnar solder 57 -is fixed to the end-face electrode 54. Thus, in the solder 57, the electrode facing portion 57A is formed facing the end-face electrode 54, and the protuberant portion 57B protruding on the back-surface 61B side of the work substrate 61 to cover the back-surface-electrode 56.

Figure 24:
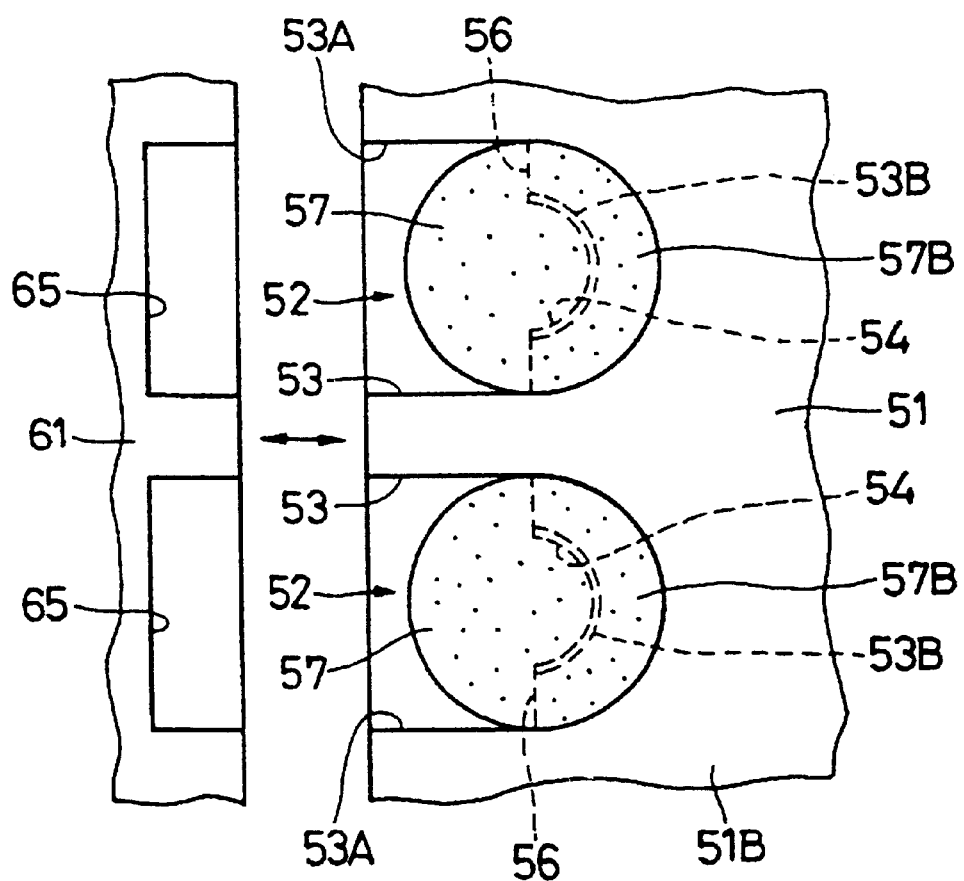
FIG. 24 is a fragmentary enlarged bottom view showing the work substrate of FIG. 22 cut and separated.

Finally, as shown in FIG. 24 in the process of cutting a substrate, the work substrate 61 and the jig 66 are cut along the two-dot chain line in FIG. 17 to form the substrate 51. In this case, the solder accommodation holes 65 are cut as shown in FIG. 24, whereby the solder accommodation portions 53A opening at the end-faces 51C of the substrate 51 are formed. Thus, the solders 57 are accommodated in the solder accommodation portions 53A. Thereafter, the substrate 51 is removed from the jig 66 to produce the module substrate.

Thus, according to this embodiment constituted as described above, substantially the same operation and working effect as that of the first embodiment can be obtained. However, in this embodiment, the back-surface electrodes 56, each connected to the end-face electrode 54, are formed on the back-surface 51B of the substrate 51. The solders 57 have the protuberant portions 57B covering the back-surface electrodes 56. Accordingly, by melting the protuberant portions 57B, the back-surface electrodes 56 and an electrode pads of the mother board can be connected to each other. The end-face electrodes 54 and the electrode pads can be connected to each other via the back-surface electrodes 56.

The back-surface electrodes 56 are provided on the back-surface 51B of the substrate 51. Accordingly, by melting the solder pastes 67 accommodated in the end-face opening grooves 53, the protuberant portions 57B can be easily formed. Thus, the production efficiency of the module substrate can be enhanced.

In the fifth embodiment, an example is described in which one module substrate is formed from one work substrate 61. As in the second embodiment, plural module substrates (e.g., four substrates) may be formed from one work substrate. In this case, two adjacent through holes of adjacent two module substrates may be punched by means of a rectangular punch such that one solder accommodation hole includes these two through holes. By cutting the work substrate along the line passing trough the centers of the solder accommodation holes, two end-face electrodes can be formed. That is, four module substrates can be simultaneously formed, similarly to the second embodiment. Thus, production efficiency can be enhanced.

Figure 25:
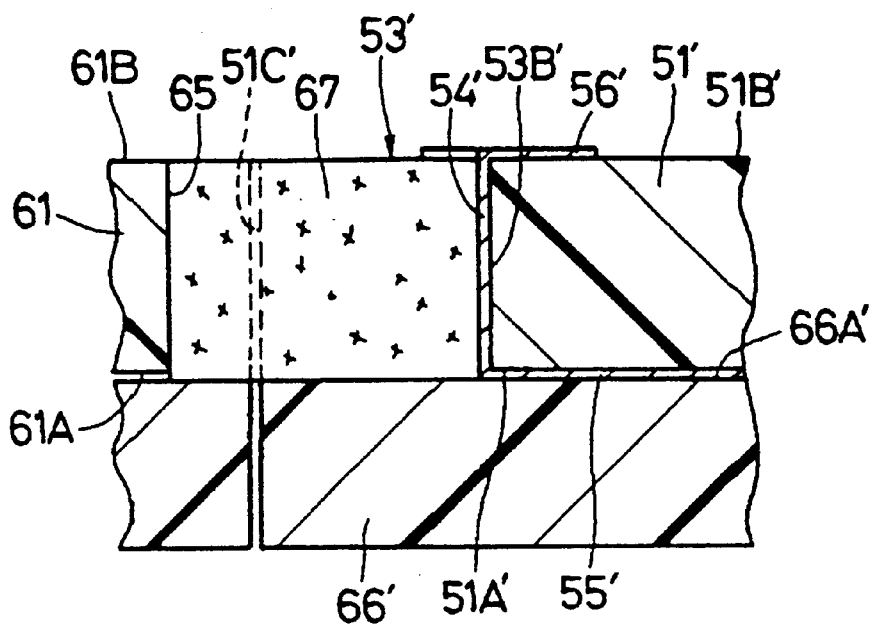
FIG. 25 is a fragmentary enlarged cross sectional view showing a work substrate according to a modification example of the fifth embodiment after the work substrate is cut, and a solder paste is placed into the solder accommodation hole.
Figure 26:
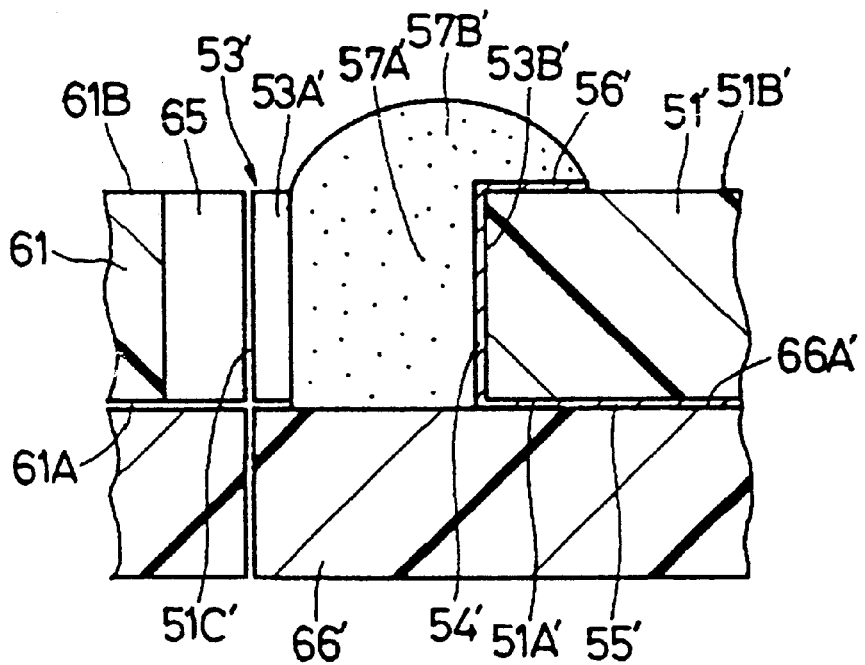
FIG. 26 is a fragmentary enlarged cross sectional view showing the solder paste of FIG. 25 after heating.
Figure 27:
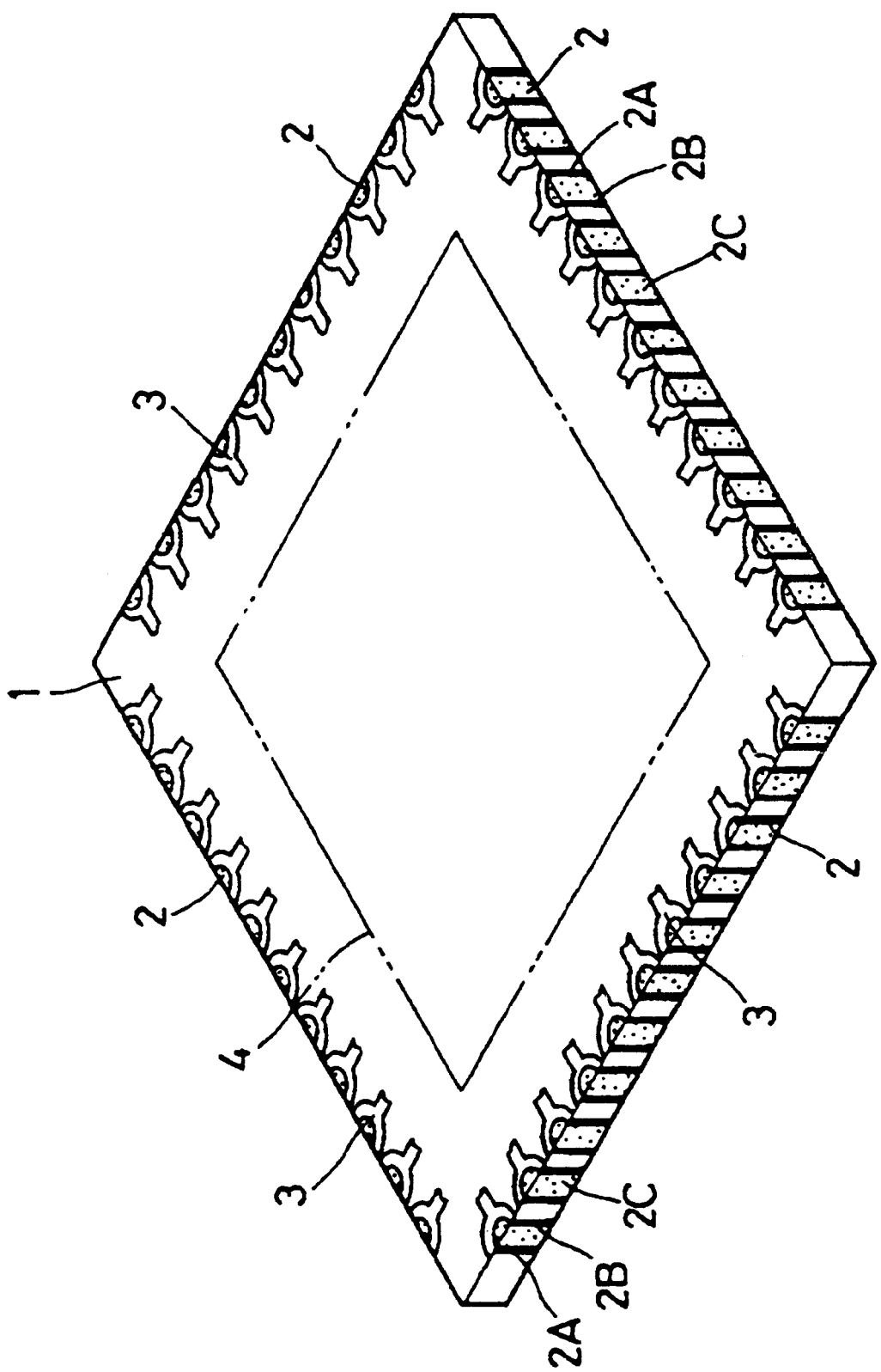
FIG. 27 is a perspective view of a module substrate as a conventional technique.
Figure 28:
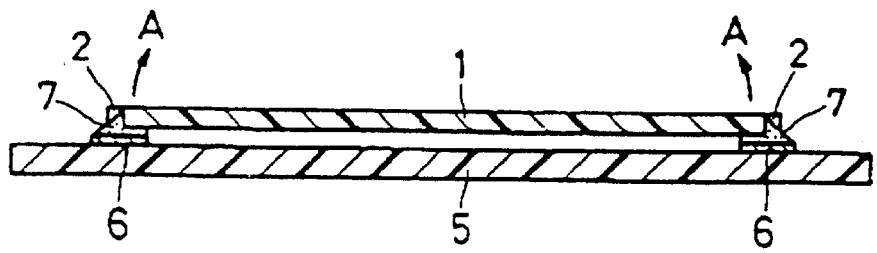
FIG. 28 is a cross sectional view showing the module substrate of FIG. 27 joined to a mother board.
Figure 29:
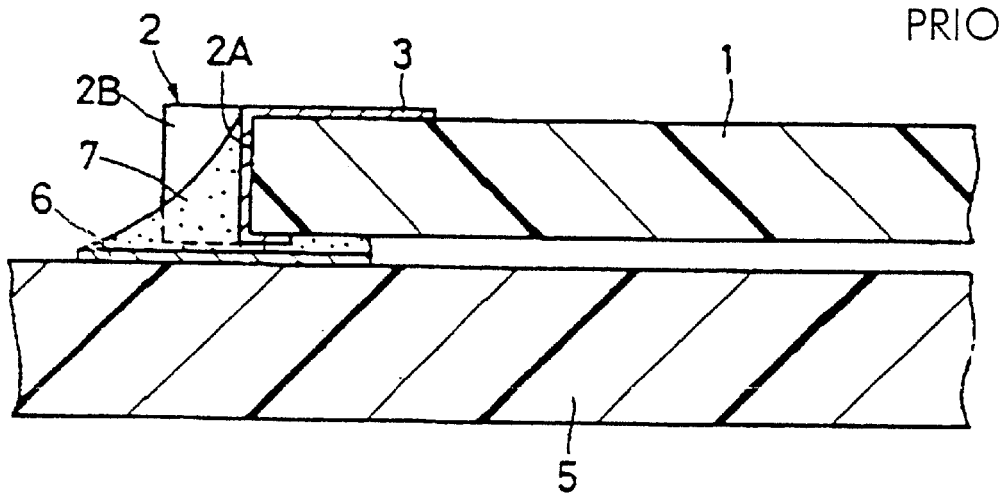
FIG. 29 is a fragmentary enlarged cross sectional view showing the end-face through-hole in FIG. 28 in enlargement.
Figure 30:
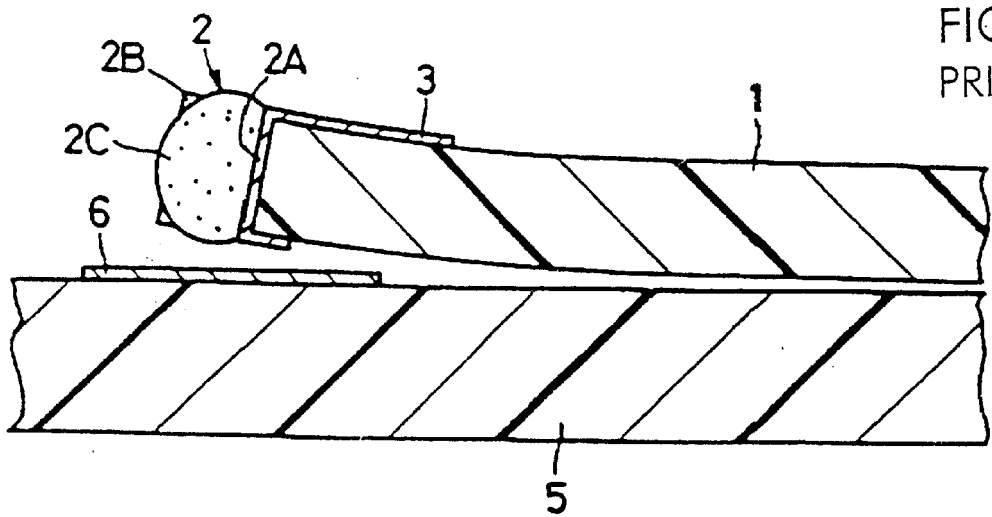
FIG. 30 is a fragmentary enlarged cross sectional view showing a work substrate which is positioned similarly to one of FIG. 29, and warped to form a gap between the end-face through-hole and the electrode pad.

Further, in the fifth embodiment, the process of cutting a substrate is carried out after the processes of accommodating a solder and heating a substrate. The present invention is not restricted to this order of processes. For example, the process of cutting a substrate may be carried out before the processes of accommodating a solder and heating a substrate, similarly to a modification example of the fifth embodiment as shown in FIGS. 25 and 26.

In this case, when the substrate is cut by means of a diamond cutter or the like, a jig 66' is bonded to the front surface 61A of the work substrate 61 before cutting, so that the substrate 51', after it is cut, is prevented from scattering.

Furthermore, when the work substrate 61 is punched by means of a punch to form the substrate 51', a so-called push back method is employed, in which the substrate 51' formed by punching is restored to be fitted in the original position in the work-substrate 61 before punching. Thereby, in the work substrate 61 after cutting, the solder accommodation holes 65 can be kept in shape and size so as to accommodate the solder pastes 67.

In the case in which the process of cutting a substrate is carried out before the processes of accommodating a solder and heating a substrate, deterioration of an electronic component or the like, caused by cleaning the substrate 51' after cutting, can be prevented, and moreover, insulation between the end-face electrodes 54' can be assured.

In particular, in some cases, at the same time when the solders 57' are fixed to the substrate 51', an electronic component is mounted onto the substrate 51'. In this case, if the process of cutting a substrate is finally carried out, it is necessary to clean the substrate 51 in order to eliminate shavings generated when the substrate 51' is cut. There arises the problem in that the cleaning deteriorates the characteristics of electronic components such as SAW (surface acoustic wave) filters, isolators, or the like.

In the case in which the solders 57 are protruded outward of the end-faces 51C' of the substrate 51', the cut solders, formed when the substrate 51' is cut, are rubbed against the end-faces 51C' of the substrate 51'. This causes a problem in that insulation between the end-face electrodes 54' cannot be performed.

On the other hand, by carrying out the process of cutting a substrate before the processes of accommodating a solder and heating a substrate, these problems can be solved.

In the fifth embodiment, the flat-plate jig 66 made of a resin material is used. As the jig, a heat resistant thin sheet having a thickness of about several millimeters may be employed.

Furthermore, in the second embodiment, the melted solders 26 are cast into the through holes 22. However, paste or finer particulate solders may be accommodated, heated, and cooled, whereby the solders are fixed to the end-face electrodes.

Moreover, in the first and fourth embodiments, the end-face opening grooves 14 are formed into a semi-circular shape. The present invention is not restricted to the semi-circular shape. For example, the end-face opening grooves may be formed so as to have a rectangular or semi-circular shape, and on the inner walls thereof, the end-face electrodes are formed.

As described above, even if warpage occurring in the substrate causes a gap between the end-face electrodes of the substrate and the electrode pads of the mother board, the tips of the solders protruding on the back surface side of the substrate contact with the electrode pads of the other board. Accordingly, by melting the solders in this state, the end-face electrodes and the electrode pads can be connected to each other, and fillets can be formed between the end-face electrodes and the electrode pads.

Preferably, the end-face electrodes are formed on the inner walls of the end-face opening grooves, and each solder comprises an electrode facing portion positioned in the end-face opening groove, facing the end-face electrode, and an protuberant portion formed so as to protrude from the electrode facing portion to be on the back-surface side of the substrate. With the electrode facing portions, the solders can be attached to the end-face electrodes in the end-face opening grooves. With the protuberant portions, the solders can be contacted with the electrode pads of the mother board.

Also preferably, back-surface electrodes are each formed on the back-surface side of the substrate in the peripheries of the end-face opening grooves, in connection to the end-face electrodes, and the back-surface electrodes are covered with the protuberant portions, respectively. Accordingly, by melting the protuberant portions of the solders, the back-surface electrodes and the electrode pads of the mother board can be connected to each other, and the end-face electrodes and the electrode pads can be connected to each other via the back-surface electrodes. Furthermore, since the back-surface electrodes are provided on the back-surface side of the substrate, the protuberant portions can be easily formed by melting the solder pastes or the like. The production efficiency of the module substrate can therefore be enhanced.

Preferably, the end-face opening grooves are each opened in a substantially semi-circular shape at the front- and back-surfaces of the substrate. Thereby, by circularly perforating the substrate, the end-face opening grooves can be easily formed.

More preferably, the solders are each positioned only on the inner side of the substrate with respect to the end-face thereof. Accordingly, the solders can be accommodated inside of the substrate without protruding from the end-faces of the substrate, and the fillets formed between the end-face electrodes and the electrode pads can be prevented from excessively extending outward of the end-faces of the substrate.

Also preferably, the solders are each positioned on the inner side of the substrate with respect to the end face thereof so as to face the end-face electrode and protrude outward of the end-face of the substrate. Accordingly, the solders each positioned on the inner side of the substrate with respect to the end-face thereof can be fixed to the end-face electrode, and moreover, a large amount of solder that could not otherwise be accommodated on the inner side of the substrate with respect to the end-face thereof, can be held at a position protruding outward of the substrate with respect to the end-face thereof. Therefore, even if a gap is formed between the end-face electrodes of the substrate and the electrode pads of the mother board, fillets can be formed between the end-face electrodes of the substrate and the electrode pads of the mother board without a shortage of the solder.

More preferably, the end-face electrodes each comprise a plane electrode formed on the end-face of the substrate, the solders each have a columnar shape elongating in the thickness direction of the substrate is fixed to the plane electrode with a part of the solder being protruded on the back-surface side of the substrate. The plane electrode can be disposed on the end-face of the substrate without the substrate being perforated and so forth. To the plane electrode, the solder having a columnar shape is attached with a part thereof being protruded on the back-surface side of the substrate. Accordingly, even if a gap is generated between the end-face electrodes on the substrate and the electrode pads of the mother board, the tips of the solders can be contacted with the electrode pads of the mother board.

Preferably, the solders are each positioned only on the outer side of the substrate with respect to the end-face thereof. Accordingly, a fillet can be formed between the end-face electrode of the substrate and the electrode pad of the mother board. Thus, the shape and size of the fillet can be visually and easily confirmed compared to that of a fillet formed inside of the substrate with respect to the end-face.

That is, the connection between the end-face electrodes and the electrode pads can be easily confirmed.

According to a method of producing a module substrate of the present invention, each solder is formed into a columnar shape longer than the thickness of the substrate on the end-face electrode, and fixed to the end-face electrode with a part of the solder having the columnar shape being protruded on the back-surface side of the substrate. Accordingly, the solders each having a columnar shape can be easily fixed to the end-face electrode by means of an adhesive or the like. Furthermore, each solder is fixed to the end-face electrode with a part of the solder being protruded on the back-surface side of the substrate. Accordingly, with the solders protruding on the back-surface side of the substrate, gaps generated between the end-face electrodes and the electrode pads, can be filled, and the end-face electrodes and the electrode pads can be connected to each other.

Furthermore, according to a further method of producing a module substrate of the present invention, a plurality of through holes are formed in line in a work substrate, an electrode film is formed on the inner wall of each through hole, the work substrate is placed on a jig having a plurality of bottomed holes in line in such a manner that the through holes are located on the bottomed holes, respectively, solders are placed into the through holes and the bottomed holes to be fixed, respectively, the work substrate and the jig are cut along the line passing through the centers of the respective through holes, and the jig is separated from the module substrate. A plurality of module substrates, each having many end-face electrodes on the end-faces of the substrate, can be simultaneously worked. The solders protruding on the back-surface side of the substrate can be easily fixed to the end-face electrodes. For this reason, the production efficiency of the module substrate is enhanced, and the manufacturing cost can be reduced.

According to yet another method for producing a module substrate, an electrode film is formed on the inner wall of each through hole in the work substrate, back-surface electrode films are provided on the back-surface side of the work substrate in the peripheries of the through holes, solder accommodation holes are formed in the work substrate, adjacently to the through holes, respectively, in such a manner that each of the through holes takes on a semi-circular shape, solders are each placed into the through holes and the solder-accommodation holes from the back-surface side thereof with the front-surface side of the through holes and the solder-accommodation holes being closed, the solders are heated to form solder protuberant portions each covering the back-surface electrode, and the work substrate is cut along a line passing through the solder accommodation holes, whereby the solders are each provided on the end-face side of the substrate. Accordingly, the end-face electrodes and the-back-surface electrodes can be formed by providing the solder accommodation holes adjacently to the through holes. Furthermore, the protuberant portions of the solders covering the back-surface electrodes can be provided by placing the solders into the through holes and the solder accommodation holes from the back-surface side while the front surface side of the through holes and the solder is closed, and heating the solders. Furthermore, by cutting the work substrate along a line passing the solder accommodation holes, the end-face opening grooves opening at the end-faces of the substrate can be provided, and moreover, the solders, each composed of the electrode facing portion and the protuberant portion, can be provided in the end-face opening groove.

Furthermore, according to another method of producing a module substrate of the present invention, an electrode film is formed on the inner wall of each through hole of the work substrate, back-surface electrode films are formed on the back-surface side of the work substrate in the peripheries of the through holes, solder accommodation holes are formed in the work substrate, adjacently to the through holes in such a manner that each through hole takes a semi-circular shape, the work substrate is cut along a line passing through the solder-accommodation holes, solders are placed into the through holes and the solder-accommodation holes from the back-surface side thereof with the front-surface side of the through hole and the solder-accommodation hole being closed, and the solders are heated to form solder protuberant portions each covering the back-surface electrode, whereby the solders are each provided on the end-face side of the substrate. The solders can be provided in each end-face opening groove after the work substrate is cut along a line passing through the solder accommodation holes, and the end-face opening grooves are formed. Accordingly, the substrate, when cut, can be cleaned before the solders are provided with the end-face opening grooves. Thus, even if an electronic component is mounted to the substrate when the solders are placed in the end-face opening grooves, respectively, deterioration of characteristics of the electronic component, caused by cleaning of the substrate, can be avoided. This enhances reliability.

What is claimed is:

1. A module substrate comprising a substrate for mounting an electronic component on the front surface side thereof, and end-face electrodes provided in end-faces defining an outer peripheral edge of the substrate and adapted to be connected to the electronic component, said end-face electrodes each being provided with a solder to be connected to a mother board provided on the back surface side of the substrate, said solder being protruded on the back surface side of the substrate past a thickness of a portion of the end-face electrode extending onto the back surface side of the substrate and comprising a columnar shape without a laterally projecting portion on the portion of the end-face electrodes disposed on the back surface side of the substrate.

2. A module substrate according to claim 1, wherein said substrate is provided with end-face opening grooves each opening at the end-faces of the substrate, said end-face electrodes are provided on the inner walls of the end-face opening grooves, respectively, and said solders each including an electrode facing portion facing the end-face electrode and being disposed in the end-face opening groove, and an protuberant portion provided so as to protrude from the electrode facing portion to the back-surface side of the substrate.

3. A module substrate according to claim 2 or 1, wherein said end-face opening grooves are each opened in a substantially semi-circular shape at the front and back surfaces of the substrate.

4. A module substrate according to any one of claims 1, 2, and 3, wherein said solders are each positioned only on the inner side of the substrate with respect to the end-face thereof.

5. A module substrate according to any one claims 1 or 2, wherein said solders are each positioned on the inner side of the substrate with respect to the end face thereof, facing the end-face electrode, and are protruded outward of the substrate with respect to the end-face thereof.

6. A module substrate according to claim 1, wherein the end-face electrodes each comprise a plane electrode provided on the end-face of the substrate, the solders each have a columnar shape elongating in the thickness direction of the substrate, and the solder is fixed to the plane electrode with a part of the solder being protruded on the back-surface side of the substrate.

7. A module substrate according to claim 1 or 6, wherein the solders are each positioned only on the outer side of the substrate with respect to the end-face thereof.

8. A method of producing a module substrate comprising a substrate for mounting an electronic component on the front surface side thereof, and end-face electrodes provided in the end-faces defining the outer peripheral edge of the substrate and adapted to be connected to the electronic component, said end-face electrodes each being provided with a solder to be connected to a mother board, the method comprising the steps of:

forming the solder into a columnar shape longer than the thickness of the substrate and past a thickness of a portion of the end-face electrode extending onto a back surface side of the substrate, and providing the solder on the end-face electrode with a part of the solder having the columnar shape being protruded on the back-surface side of the substrate such that the solder does not have a portion extending laterally from the columnar shape onto the portion of the end-face electrode extending into the backsurface side of the substrate.

* * * * *